United States Patent
Ryan et al.

(10) Patent No.: US 10,063,152 B2
(45) Date of Patent: Aug. 28, 2018

(54) STORAGE TIME CONTROL

(71) Applicant: Power Integrations, Inc., San Jose, CA (US)

(72) Inventors: Paul Ryan, Cambridgeshire (GB); Johan Piper, Cambridgeshire (GB)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 15/451,235

(22) Filed: Mar. 6, 2017

(65) Prior Publication Data
US 2017/0179810 A1    Jun. 22, 2017

Related U.S. Application Data

(63) Continuation of application No. 14/283,857, filed on May 21, 2014, now Pat. No. 9,621,050.
(Continued)

(51) Int. Cl.
*H02M 3/335* (2006.01)
*H02M 3/156* (2006.01)
(Continued)

(52) U.S. Cl.
CPC ......... *H02M 3/33507* (2013.01); *H02M 1/08* (2013.01); *H02M 3/156* (2013.01); *H02M 2001/0009* (2013.01); *H02M 2001/0054* (2013.01); *H03K 17/04213* (2013.01); *Y02B 70/1491* (2013.01)

(58) Field of Classification Search
CPC .. H02M 3/335; H02M 3/156; H02M 3/33507; H02M 2001/0009; H02M 2001/0054; H02M 1/36; Y02B 70/1491; H03K 17/04213
See application file for complete search history.

(56) References Cited

U.S. PATENT DOCUMENTS

| 4,318,011 A | 3/1982 | Zeis |
| 5,017,802 A | 5/1991 | Feldtkeller |

(Continued)

FOREIGN PATENT DOCUMENTS

| CN | 102957304 | 3/2013 |
| WO | WO 83/00590 A1 | 2/1983 |

(Continued)

OTHER PUBLICATIONS

PRC (China) Application No. 201410242007.4—First Office Action and Search Report with English Translation dated Sep. 29, 2017, 22 pages.

*Primary Examiner* — Kyle J Moody
(74) *Attorney, Agent, or Firm* — Christensen O'Connor Johnson Kindness PLLC

(57) ABSTRACT

A controller for use in a power converter includes a first terminal to provide a turn on signal to initiate turning on of a power switch and a second terminal to provide a turn off signal to initiate turning off the power switch. A detection circuit is coupled to detect a turn off time delay. The turn off time delay is the duration of time between an initiating of a turn off of the power switch by the turn off signal and an actual turn off of the power switch. A control circuit is coupled to control the turn on signal to regulate the turn off delay time to a target time value. The control circuit controls the turn on signal by controlling an amount of charge delivered to turn on the power switch.

25 Claims, 21 Drawing Sheets

Related U.S. Application Data

(60) Provisional application No. 61/829,404, filed on May 31, 2013.

(51) Int. Cl.
  *H02M 1/08* (2006.01)
  *H02M 1/00* (2006.01)
  *H03K 17/042* (2006.01)

(56) References Cited

U.S. PATENT DOCUMENTS

| | | |
|---|---|---|
| 5,019,955 A | 5/1991 | Hoeksma |
| 6,348,819 B1 | 2/2002 | Ten Pierick et al. |
| 6,377,087 B1 | 4/2002 | Gradzki |
| 7,218,164 B2 | 5/2007 | Vitale et al. |
| 7,362,147 B2 | 4/2008 | Rebholz-Goldmann |
| 7,567,445 B2 | 7/2009 | Coulson et al. |
| 7,944,722 B2 | 5/2011 | Coulson et al. |
| 8,446,746 B2 | 5/2013 | Coulson et al. |
| 8,634,212 B2 | 1/2014 | Tang et al. |
| 8,659,345 B2 | 2/2014 | Xu et al. |
| 9,042,126 B2 | 5/2015 | Cheng et al. |
| 2010/0165666 A1 | 7/2010 | Wang et al. |
| 2010/0202165 A1 | 8/2010 | Zheng et al. |
| 2010/0289463 A1 | 11/2010 | Wang et al. |
| 2011/0026279 A1 | 2/2011 | Li et al. |
| 2011/0096572 A1 | 4/2011 | Liang et al. |
| 2012/0250360 A1 | 10/2012 | Orr et al. |
| 2014/0009974 A1 | 1/2014 | Shen et al. |
| 2014/0009977 A1 | 1/2014 | Huang et al. |
| 2014/0056036 A1 | 2/2014 | Pan et al. |
| 2014/0232187 A1 | 8/2014 | Ryan et al. |
| 2014/0233269 A1 | 8/2014 | Feng et al. |
| 2014/0355314 A1 | 12/2014 | Ryan et al. |
| 2015/0016151 A1 | 1/2015 | Bhasin et al. |
| 2016/0359403 A1 | 12/2016 | Werner et al. |

FOREIGN PATENT DOCUMENTS

| | | |
|---|---|---|
| WO | WO 2008/132508 A2 | 11/2008 |
| WO | WO 2008/132509 A2 | 11/2008 |

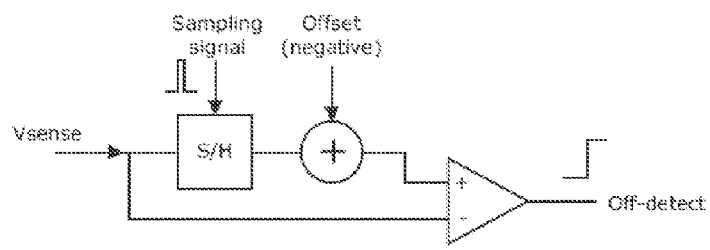
Fig. 20a
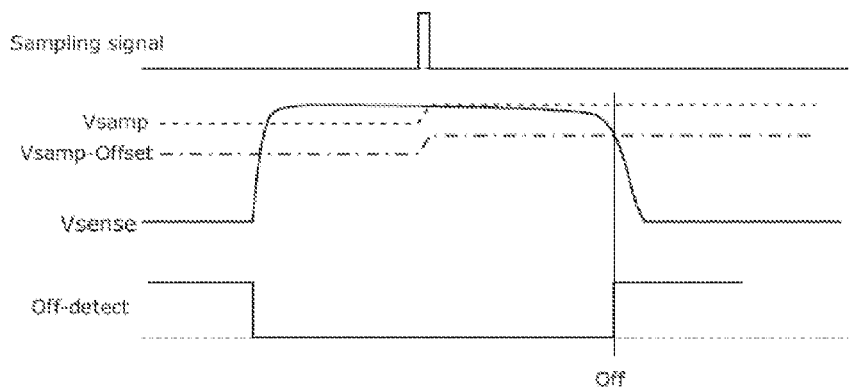
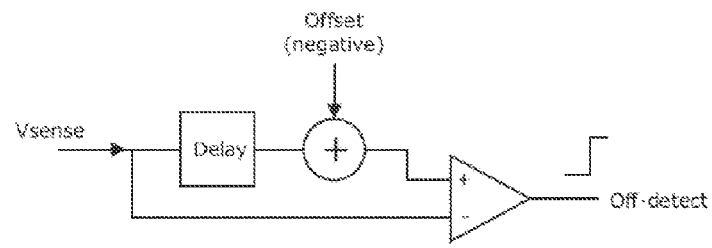
Fig. 20b
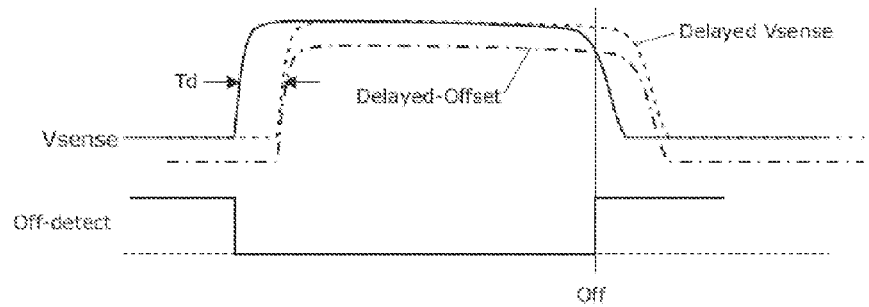

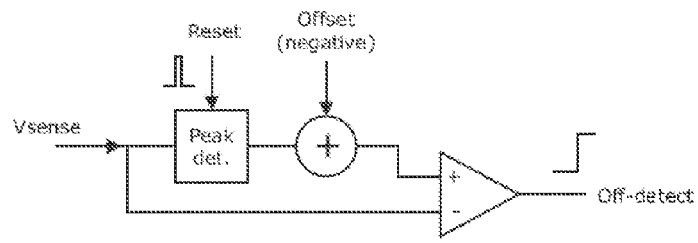
Fig. 20e
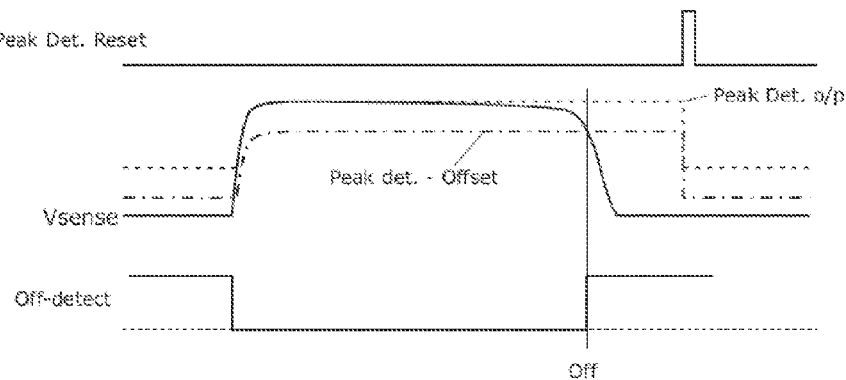
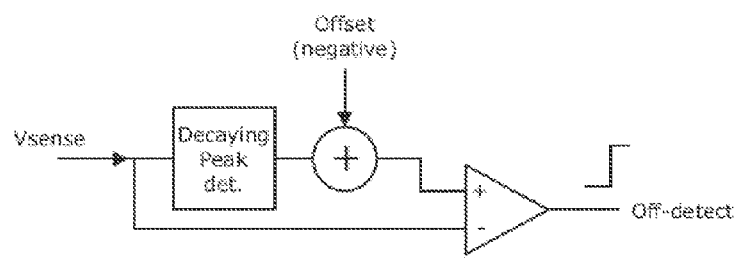
Fig. 20f
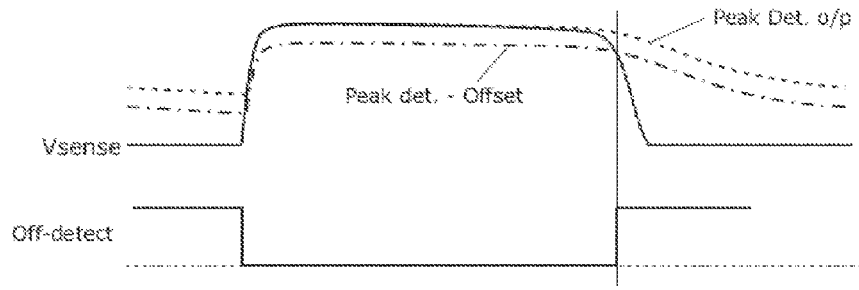

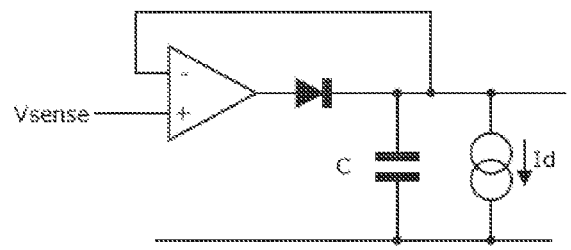
Fig. 21a
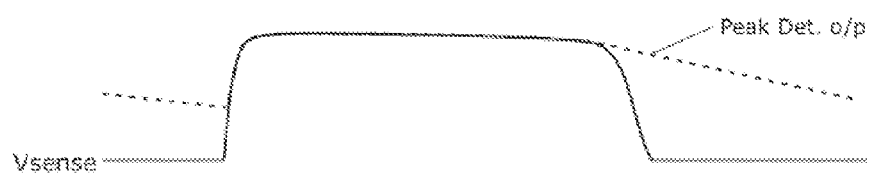
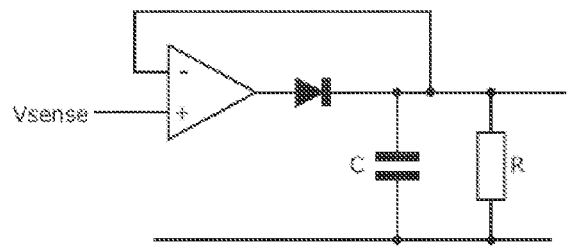
Fig. 21b
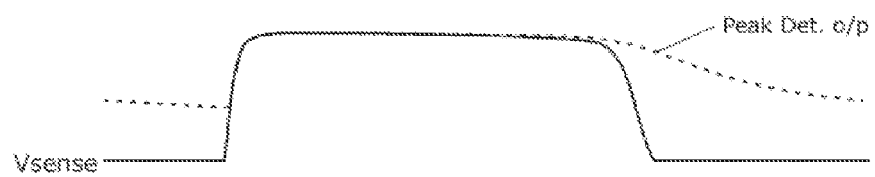

STORAGE TIME CONTROL

RELATED APPLICATIONS

This application is a continuation of U.S. application Ser. No. 14/283,857, filed May 21, 2014, now pending, which claims priority under 35 U.S.C. 119(e) to U.S. Provisional Application No. 61/829,404, filed May 31, 2013. U.S. application Ser. Nos. 14/283,857 and 61/829,404 are incorporated herein by reference in their entirety.

FIELD OF THE INVENTION

This invention generally relates to methods of indicating an on time of a power switching device of a switch mode power converter (SMPC) and switching control systems for controlling an on time of a power switching device of an SMPC, and more particularly to an SMPC.

BACKGROUND TO THE INVENTION

Bipolar transistors, conventionally bipolar junction transistors (BJTs) but also including insulated gate bipolar transistors (IGBTs), have been used in switched mode power converters (SMPCs) for many years. BJTs in particular are relatively inexpensive and rugged devices, with low on-state resistance and high power density.

The use of a low cost bipolar junction transistor (BJT) as the primary switch in an offline power converter is desirable, since it provides both high breakdown voltage and low on-state voltage. However, difficulties are presented by the BJT's current-controlled nature. Switching the BJT efficiently at the required high frequencies (50-100 kHz) demands careful management of charge into and out of the base terminal. This is of particular concern for modern, low-cost, offline power converters: efficiency requirements, both in active and no-load conditions, along with ever-shrinking form factors demanded by consumer electronics applications, place stringent limits on what is achievable.

In more detail, the bipolar nature of a transistor can lead to high switching (turn-on and turn-off) losses, as during the transitions significant current may flow through the switch whilst there is a voltage across it. Furthermore optimal drive of BJTs is not always straightforward, at least in part due to charge storage in the device and the relatively high power dissipation of their current drive requirements. Charge storage in the BJT may delay the instant at which the switch turns off. This may be achieved internally or intrinsically in the BJT (e.g. in the base region).

On the other hand, switching MOSFETs may have lower switching losses, allowing MOSFET-based SMPCs to run at higher switching frequencies with acceptable efficiency. A higher switching frequency may allow the size of some of the SMPC's inductive components to be reduced. Furthermore, relatively simple, efficient drive schemes are afforded by the MOSFET's voltage-driven nature. For at least these reasons, MOSFETs have replaced BJTs in some SMPC applications, despite the relatively higher cost of a MOSFET.

Attempts have been made to improve BJT drive, both to reduce switching losses and to minimise the power dissipation of the drive circuits. The 'proportional base drive' approach makes the base drive current proportional to the load, or collector, current. However a conservative estimate of BJT gain is required in such schemes, to ensure that sufficient base drive current is delivered for all operating conditions and all BJTs within the chosen specification. This inevitably leads to unnecessarily high power dissipation for the majority of operating conditions and BJTs. The consequences of insufficient BJT base drive can be severe, as the switch may become increasingly resistive whilst conducting considerable current. Dramatic switch failure may result.

In view of the above, the fields of transistor control and SMPCs continues to provide a need for an improved transistor drive scheme. A preferred drive scheme may be optimised for, e.g., efficiency, for example of BJT driving and preferably for a wide range of BJTs, and/or for reliability, accuracy, cost, size and/or complexity, etc.

For use in understanding the present invention, the following disclosures are referred to:

U.S. Pat. No. 4,318,011 of Licentia;
U.S. Pat. No. 6,348,819 of Philips;
U.S. Pat. No. 5,017,802 of Siemens;
U.S. Pat. No. 6,377,087 of Philips;
WO83/00590 of Gould Inc;
U.S. Pat. No. 7,218,164 of STMicroelectronics;
U.S. Ser. No. 11/445,473, U.S. Ser. No. 12/405,618 and U.S. Ser. No. 12/752,611, international applications PCT/GB2008/050300 (WO2008/132508 and WO2008/132509), and unpublished provisional application U.S. 61/767,023 filed on Feb. 20, 2013, of Cambridge Semiconductor Ltd.

SUMMARY OF THE INVENTION

The invention therefore provides a method of controlling turn off time delay of a switching device of a switch mode power converter (SMPC), the SMPC comprising: an inductive component comprising an input winding coupled to receive power from an input to said SMPC; and a switching device configured to, when on, conduct current of said input winding; the method comprising: applying at least one turn on signal to cause conduction of the switching device; applying at least one turn off signal, to initiate turning off of the switching device, said turning off having a duration comprising a turn off time delay of the switching device; detecting a sensing signal from a further winding of the inductive component, to thereby indicate an end of said turn off time delay, wherein the further winding is inductively coupled to the input winding; and controlling the turn on signal for a subsequent conduction of the switching device to regulate a subsequent turn off delay time.

In some embodiments the detection comprises inputting the sensing signal to a peak detector. In general the method comprises controlling an amount of charge delivered to control the switching device on, in particular by controlling a voltage source or a current source, comparing the turn-off delay time to a target time value to thereby control the turn off time delay to approach the target time. In embodiments the amount of charge may be controlled by controlling 1) a resistance or 2) a resistance in parallel with either a voltage source or a current source.

In broad terms, delivering a large charge to the control terminal reduces the voltage across the switching device in the on state (if the charge delivered is too small the device can be damaged by dissipating too much power). However energy is lost as the voltage across the device increases when the device is turned off, and the greater the charge to extract, the greater the wasted power. Thus embodiments of the method select a (fixed) target time to balance an increased input charge amount for a low on-state voltage drop across conduction terminals of the switching device with the power loss during turn-off. In principle the target time may be varied with the input supply voltage—if this voltage is low the power loss is more sensitive to the voltage across the switching device when switched on; if the supply voltage is high the power loss is less sensitive to the voltage across the switching device when on, but the energy loss during turn-off may be increased. Thus the target time may be varied (for example, by defining values in a lookup table), according to the supply voltage to optimise for overall efficiency (low power loss). This may be generalised to vary the target time in response to other operating conditions, for example the delivered power or operating (switching) frequency of the SMPC, an on-time of said switching device, and/or a temperature of said SMPC or of the switching device. Optionally a limit (in particular an upper limit) may be provided for the target time to reduce the risk of an overly long target time interfering with a higher level power delivery control loop for the SMPC (which, in embodiments, controls the total turn-on time), or too short a target time which may risk premature turn-off (causing high power loss and risking damage to the switching device).

The invention also provides a method of detecting turn off of a switching device of a switch mode power converter (SMPC), the SMPC having an input circuit comprising: an inductive component comprising an input winding coupled to receive power from an input power source to said SMPC; and a switching device configured to, when on, conduct current of said winding; the method comprising: sensing a voltage of the input circuit or of a winding coupled to the input circuit, dependent on a voltage across conduction terminals of the switching device; deriving both a sensing signal and a sensing reference from said sensed voltage; performing a comparison of said sensing signal and said sensing reference; and indicating turn-off of the switching device responsive to said comparison.

The comparison is preferably a comparison with an offset and/or scale factor; it may be a direct comparison or performed, for example, by comparing a difference between the sensing signal and sensing reference with a threshold. In general the comparison detects a crossing, more particularly an offset crossing, of the sensing signal and sensing reference. The sensing reference may a delayed, offset version of the sensing signal (or vice versa), or a low-pass version of the signal. Processing of signals may be in the sensing signal path and/or the reference path. For example, a high-pass filter may be used in the signal path and a fixed, or adaptive threshold in the reference path. Alternatively the sensing reference may be a peak detected or decaying peak detected version of the sensing signal.

In the above described methods the switching device may be a bipolar junction transistor (BJT) or an insulated gate bipolar transistor (IGBT). An IGBT may be considered as a PNP emitter follower in combination with a MOSFET and thus collector-emitter voltage (Vce) is a function of base current (Ib) and the channel resistance of the MOSFET. Turning the MOSFET on more strongly results in an increased Ib and decreased Vce but longer turn-off delay and increased turn-off energy loss, and thus the skilled person will appreciate that embodiments of the techniques we describe are applicable to IGBTs as well as BJTs. Thus the conduction terminals may comprise collector and emitter terminals of the switching device and the control terminal may comprise a base or gate terminal.

Embodiments of the methods and systems described herein may also detect premature turn-off by detecting the start of turn-off of the switching device prior to a turn-off signal (desaturation protection). Then the device maybe forced to turn off (with the turn-off signal) and/or a magnitude of the turn-on signal may be increased in a subsequent switching cycle. Additionally or alternatively the SMPC may be changed to a protective mode of operation, for example a reduced power mode or disabled.

The invention also provides corresponding control systems and SMPCs configured to implement the above-described methods.

Thus in another aspect the invention provides a switching control system for controlling turn off time delay of a switching device of a switch mode power converter (SMPC), the SMPC comprising: an inductive component having an input winding coupled to receive power from an input to said SMPC; and a said power switching device configured to, when on, conduct current of said input winding, the switching control system comprising: at least one output to provide at least one turn on signal to cause conduction of the switching device and at least one turn off signal, to initiate turning off of the switching device, said turning off having a duration comprising a turn off time delay of the switching device; a detection circuit to detect a sensing signal from a further winding of the inductive component, to thereby indicate an end of said turn off time delay, wherein the further winding is inductively coupled to the input winding; and a control circuit to control the turn on signal for a subsequent conduction of the switching device to regulate a subsequent turn off delay time.

In a related aspect the invention provides a switching control system for detecting turn off of a switching device of a switch mode power converter (SMPC), the SMPC comprising: an inductive component comprising an input winding coupled to receive power from an input power source to said SMPC; and a switching device configured to, when on, conduct current of said winding; the switching control system comprising: an input to receive a sensing signal sensing a voltage of the input circuit or of a winding coupled to the input circuit, dependent on a voltage across conduction terminals of the switching device; a detection circuit to derive both a sensing signal and a sensing reference from said sensed voltage, and to perform a comparison of said sensing signal and said sensing reference; and at least one output, coupled to said detection circuit, to indicate turn-off of the switching device responsive to said comparison.

The skilled person will appreciate that the above described systems may be implemented in circuitry and/or software on a signal processor. The circuitry may be analogue or digital or a combination of the two; it may be partly or wholly implemented in an integrated circuit (although in embodiments the switching device is separate). The system or a circuit for the system may be provided in the form of software on a carrier, for example defined in a hardware description language.

According to a further aspect of the present invention, there is provided a method of indicating an on time of a power switching device of a switch mode power converter (SMPC), the on time comprising at least a turn off delay time of the power switching device, the SMPC comprising: an inductive component comprising an input winding coupled to receive power from an input to said SMPC; and a power switching device configured to, when on, conduct current of said winding, the method comprising: applying at least one turn off signal, to initiate turning off of the power switching device, said turning off having a duration comprising a turn off time delay of the power switching device; detecting decay of a sensing signal from a further winding of the inductive component, to thereby indicate an end of said turn off time delay, wherein the further winding is inductively coupled to the input winding; indicating a said on time of the power switching device on the basis of a start time indicator of said on time and said indication of said end of the turn off time delay.

Thus, an embodiment may allow more power efficient use of a power switching device such as a BJT, by allowing variation of an on time comprising a variable turn off delay time to be monitored and preferably used for subsequent control of the device. This is achievable without direct monitoring of the switching device, rather by inductive coupling to monitor the winding and thus infer the state of the switching device. For example, this may effectively provide indirect measurement of the BJT collector terminal voltage.

Such an embodiment may advantageously be suitable for low cost SMPCs, since direct measurement of the high voltages present is generally not required. More specifically, this may means that the cost, space, additional sensing input, and/or power dissipation of high voltage parts that are required to directly measure the high voltage across the input winding can be reduced or avoided. Use of the further winding (this generally being a low voltage coupled winding compared to the input winding) may thus bring advantages of turn off delay time regulation with minimal excess cost.

The indication of on time may be useful for controlling a subsequent on time, e.g., turn off time delay. Generally speaking, a shorter turn-off delay time may reduce power dissipation by reducing base current requirements and/or wastage of energy dissipated during turn-off. Furthermore, control to minimise turn-off time may reduce switching losses in a BJT. Furthermore, if the turn off delay time is too short conduction losses in a BJT may be increased. Such losses may depend on the particular converter and the load. Thus, an embodiment advantageously minimises power consumption and/or maximises power efficiency, preferably with variable load.

Additionally or alternatively, such indication of on time may allow a fault condition, for example those causing deep saturation of the BJT, or premature desaturation, to be rapidly detected.

The initiation of turning off may be achieved for example by outputting a turn off signal to control a switch to couple the control terminal of the power switching device to a reference voltage such as ground. Additionally or alternatively, a signal source to the control terminal may be turned off and/or the signal source and control terminal uncoupled, using the and/or other) turn off signals. Further, one of the conduction terminals of the switching device (preferably the emitter) can be decoupled from a reference voltage by an additional switch (such as a transistor) to cause the power switching device to turn off more quickly or to avoid undesirable effects such as breakdown of the switching device.

During turn off of the switch, the sensing signal decays generally towards a reference voltage, e.g., gnd/OV, regardless if decay is from a positive or negative value, i.e., has positive or negative rate of change. Preferably, the sensing signal is a voltage monitored, e.g., using an auxiliary primary side winding where the inductive component has primary and secondary sides, or a sense winding. The signal may be compared to a threshold value and/or monitored for rapid change, e.g., rise, to indicate the end of the turn off delay time.

There may still further be provided the method, wherein the decay detection comprises inputting the sensing signal to a peak detector to detect said decay. Such a detector may comprise, e.g., a linear, non-linear or leaky peak detector.

There may further be provided the method, the method comprising generating a decay signal approximating a decaying portion of the sensing signal, conducting current to the further winding to thereby increase a rate of decay of the decay signal, and comparing the decay signal and the decaying portion of the sensing signal to indicate the end of the turn off time delay. Such an arrangement may be provided by a non-linear peak detector.

There may further be provided the method, comprising detecting at least a last one of a plurality of crossings of said decay and sensing signals, said plurality of crossings during a switching cycle of the power switching device, said last one before final decay portion of the sensing signal to a reference value (the sensing signal will generally have decayed to some extent before at least the last crossing point is reached), to thereby indicate the end of the turn off time delay. The last crossing may be prior to the sensing signal crossing some other predetermined reference or occurring within a predetermined time since start of the turn off signal. In embodiments the timing of the last one of such crossings, or an average timing of such crossings, may be used to indicate when turning off ends.

There may yet further be provided the method, wherein the decay detection comprises sampling a value of the sensing signal when the power switching device is on, and detecting when the sensing signal deviates by a threshold value from the sampled value to thereby detect the end of the turn off time delay.

In an embodiment, the decay detection comprises detecting when a decaying portion of the sensing signal crosses a threshold.

There may still further be provided the method, wherein the turn off time delay is during a first switching cycle of the SMPC, the method comprising controlling, on the basis of the provided indicator, an amount of charge delivered to control the switching device on during a second switching cycle of the SMPC (e.g., to turn the switching device on and maintain that switching device on for part of the second switching cycle), to thereby control a further turn off time delay of the said switching device on the basis of the indicated turn off time delay, said further turn off time delay during said second switching cycle. Such an embodiment may be used to ensure that switching device operation is optimal and/or most efficient in changing load conditions and/or variations in conditions, advantageously potentially for a wide range of types of switching devices.

Preferably the amount of charge is the total charge delivered to a control terminal (e.g., base, gate) of the power switching device during a switching cycle. Delivery of the amount of charge may comprise current flow in or out of the control terminal depending on the type of power switching device (e.g., npn or pnp). Such current flow may be provided by, e.g., a controllable bias signal to the base of an emitter-switched transistor of a cascode arrangement, or a base control signal of a bipolar transistor in common-emitter configuration. In a cascode arrangement, the amount of charge may be that delivered by a bias signal to a control terminal of an emitter-switched transistor, preferably when a corresponding common-emitter transistor is on. Where the switching device is an IGBT the variation of charge may be provided from a source of variable voltage, the charge variation causing a variable conduction of the channel within the IGBT to vary the on-state voltage across the conduction terminals and the energy loss during turn-off.

There may further be provided the method, wherein the controlling the amount of charge is performed on the basis of comparing the indicated on time to an indicator of a target time value, to thereby control the further turn off time delay to approach a target time value. Such a target time value may be set at a value to minimise total power loss due to conduction losses and turn-off losses in a bipolar transistor, preferably with variable load. Such setting of the value may advantageously be adaptable, e.g., to control the target depending on input voltage, output power, other conditions and details of the SMPC such as the type of switching device. The target time value may be in the range 100 nanoseconds to 300 nanoseconds.

There may further be provided the method, comprising providing a device control signal to a control terminal of the power switching device to drive, e.g., bias, the switching device on, and wherein a said turn off signal controls a source of said device control signal (e.g., source of base current Ib) to turn off.

There may further be provided the method, wherein a said turn off signal controls a switch (e.g., opens the switch/turns the switch off) to decouple a control terminal of the power switching device from a device control signal source (e.g., Ib current source), said device control signal source for providing a device control signal to drive the power switching device on.

In an embodiment, a said turn off signal controls a switch (e.g., closes the switch/turns the switch on) to couple a control terminal of the power switching device to a reference voltage (e.g., ground) to thereby turn off the switching device. Advantageously, the coupling to the reference voltage discharges the control terminal during a charge storage time of the power switching device; the turn off delay time comprising at least the charge storage time.

There may yet further be provided the method, wherein the applying at least one turn off signal to initiate turning off of the switching device comprises decoupling one conduction terminal from a reference voltage, preferably where the conduction terminal is the emitter of the switching device.

There may yet further be provided the method, wherein the applying at least one turn off signal to initiate turning off of the switching device comprises: inhibiting inputting of a device control signal to said control terminal of the power switching device; and while said inputting is inhibited, coupling the control terminal to a reference voltage (e.g. ground) to turn off the power switching device by discharging the control terminal.

There may further be provided the method, comprising turning on the power switching device (e.g., in a first or second switching cycle mentioned above regarding controlling the amount of charge) using the following steps: inputting a device control signal (e.g., base current) having a first amplitude to a control terminal of the power switching device, said device control signal for turning the power switching device on; and reducing the device control signal to a second, lower amplitude such that the reduced device control signal maintains the power switching device on. Preferably the first, higher amplitude causes the device to switch on rapidly. Preferably the second, lower amplitude is sufficient at least to sustain conduction between the conduction terminals (e.g., collector and emitter, or drain and source) of the device.

Advantageously, an embodiment having the higher first amplitude may provide a fast turn-on the power switching device; this may be useful for example in converter topologies featuring high switch current early in the switch on-time, such as the forward converter or the continuous conduction mode flyback or boost converter.

Furthermore, there may be provided the method, wherein the controlling said amount of charge comprises controlling, e.g., duration or amplitude of the device control signal during the device control signal portion corresponding to the first (or second) amplitude, said controlling according to a said power, e.g. based on an I/V on the input or output of an SMPC comprising the power switching device.

There may further be provided the method, wherein said power switching device is a first transistor and the SMPC further comprises a second transistor, the first transistor coupled in series between the second transistor and the input winding, wherein the applying at least one turn off signal comprises the steps of turning said second transistor off and coupling a control terminal of the first transistor to a reference voltage to thereby turn off the first power transistor, preferably by discharge of the control terminal during a turn off delay time.

Such a method preferably involves a cascode circuit having the emitter-switched first, transistor and wherein the control terminal is the base or gate terminal of the first transistor, the second transistor coupled to switch the emitter terminal of the first transistor. The use of a cascode arrangement may allow fast switching, high voltage tolerance (and thus reliability) and/or lower no-load power consumption. Furthermore, such an arrangement, and the other arrangements described herein, may allow an auxiliary recharge technique for powering control of one or more switching devices in an embodiment.

To provide the above auxiliary recharge technique, there may further be provided the method, comprising: establishing a flow of current from said input winding through said first transistor; and diverting said current through a conduction path to a charge store while controlling said second power transistor off (e.g., so that the emitter of a said first transistor is decoupled from the input voltage); and providing power from said charge store to thereby power control of switching of at least one switching device (e.g., of the above first and/or second transistor, preferably and/or one or more control switches) of the SMPC.

There may still further be provided the method, wherein the switching device comprises a bipolar transistor such as a bipolar junction transistor (BJT) or an insulated gate bipolar transistor (IGBT). However, the method could be applied similarly to a field effect transistor (FET), e.g., MOSFET, in gate- or source-switched configurations.

In embodiments the (power) switching device is able to operate with a voltage in the range 20V or 100V upwards, and typically with a current in the range 10 mA upwards, typically higher than 0.1 A, and capable of handling power from a few milliwatts to 1 Watt or greater.

An embodiment is a method of regulating power transfer of a switched mode power converter (SMPC), the method comprising controlling an on time of a power switching device of the power converter, said on time comprising at least a turn off delay time of the power switching device, said control comprising using the method of the first aspect to detect the end of a first turn off time delay and to control the further turn off time delay of the power switching device on the basis of said detected end, wherein said control of the further turn off time delay is performed to thereby control said on time to thereby regulate said power transfer. The power transfer regulation preferably comprises pulse width modulating (PWM) a control/bias signal to a control terminal of the power switching device, to thereby control power transfer of the SMPC.

According to another aspect of the invention, there is provided a method of indicating an on time of a power switching device of a switch mode power converter (SMPC), the on time comprising at least a turn off delay time of the power switching device, the SMPC comprising: an inductive component having a winding coupled to receive power from an input to said SMPC; and a power switching device configured to, when the power switching device is on, conduct current from said winding; the method comprising: applying at least one turn off signal, to initiate turning off of the power switching device during a switching cycle of the SMPC, a duration of said turning off comprising a turn off time delay; obtaining a sensing signal from a sensing signal source, the sensing signal varying according to switching of the power switching device; and inputting the sensing signal to a detection circuit to generate, based on the sensing signal, a decay signal approximating a decaying portion of the sensing signal and having a rate of decay different from a rate of decay of the sensing signal such that the decay signal crosses the decaying portion of the sensing signal; detecting when the decaying portion of the sensing signal crosses said decay signal, to thereby indicate an end of said turn off time delay; and indicating a said on time of the power switching device on the basis of a start time indicator of said on time and said indication of said end of said turn off time delay.

In an embodiment, peak detection may allow power efficient use of a power switching device such as a BJT, by allowing variation of an on time comprising a variable turn off delay time to be monitored and preferably used for subsequent control of the device, and/or may allow rapid fault detection. Furthermore, circuitry may be minimised by re-use of peak detection circuitry for example used to sense an output voltage in an embodiment. Thus, cost and/or space efficiencies may be obtained.

As for the previous aspects, similar advantage(s) and/or optional feature(s) may apply. For example, the turn off time delay may be as defined above, and the winding may be a primary winding of an inductive component, e.g., transformer, having primary and secondary sides. Similarly, the switching cycle generally comprises and on phase and an off phase of the power switching device, in any order. Furthermore, the sensing signal source may comprise a sense or auxiliary winding of the inductive component. The variation of the sensing signal according to the switching preferably entails variation substantially synchronous and/or substantially following current or voltage on a terminal, e.g., base or collector, of the power switching device. Preferably, the different rate of decay of the decay signal is lower than the rate of decay of the decaying portion being approximated.

There may further be provided the method, comprising detecting a last one of a plurality of crossings of said decay and sensing signals before decay of the sensing signal to a reference value, to thereby indicate the end of the turn off time delay.

The skilled person will appreciate that there are many ways in which power may be transferred to the load. For example in some embodiments the inductive component is arranged to provide power to a load via an additional winding of the inductive component; in others power may be provided directly from the input winding. In embodiments an auxiliary or sense winding is galvanically connected to the input winding. Where it is appropriate to talk about a primary side of the inductive component then, in preferred embodiments, the previously described control schemes are implemented on the primary side of the SMPC.

In embodiments the method further comprises deriving the sensing signal from a conduction terminal (e.g., collector, emitter, source or drain) of the power switching device, said current flowing between said winding and the power switching device via the conduction terminal. The deriving the sensing signal may allow to monitor collector or emitter voltage of a BJT said power switching device, e.g., to monitor for when a collector voltage drops by a predetermined amount, e.g., about 30V.

The method may further comprise deriving the sensing signal from a control terminal of the power switching device. Such deriving may allow the system to monitor base (or gate) current or voltage of the device, e.g., to monitor for when a base current becomes substantially zero or has reduced by predetermined amount.

There may further be provided an embodiment of the method, wherein the turn off time delay is during a first switching cycle of the SMPC, the method comprising controlling, on the basis of the provided indicator, an amount of charge delivered to control the power switching device on during a second switching cycle of the SMPC, to thereby control a further turn off time delay of said power switching device on the basis of the indicated turn off time delay, said further turn off time delay during said second switching cycle. Additional features, for example regarding the amount of charge, may be as previously described.

According to a still further aspect of the present invention, there is provided a switching control system for controlling an on time of a switching device of a switched mode power converter (SMPC), the on time comprising at least a turn off delay time of the power switching device, the SMPC comprising: an inductive component having an input winding coupled to receive power from an input to said SMPC; and a said switching device configured to, when on, conduct current of said input winding, the switching control system comprising: at least one output to provide at least one turn off signal to initiate turning off of a said power switching device, said turning off having a duration comprising a said turn off time delay; and an input to receive a sensing signal from a further winding of the inductive component, the further winding inductively coupled to the input winding; a detector circuit configured to detect decay of the sensing signal, to thereby indicate an end of the turn off time delay; and an output configured to indicate a said on time on the basis of a start time indicator of the on time and said indicated end of the turn off time delay.

In embodiments of the system the detector circuit comprises: a circuit coupled to said input to generate a decay signal approximating a decaying portion of the sensing signal, such that decay of said decay signal is slower than the decay of the sensing signal such that the sensing signal crosses the decay signal. A comparator may then compare the decay signal with the sensing signal to identify when the decaying portion of the sensing signal crosses the decay signal, to thereby indicate the end of the turn off time delay. Embodiments of the system may be configured to detect the end of the turn off time delay by identifying a last said crossing prior to the sensing signal decaying to a reference voltage.

In embodiments of the system the detector circuit comprises a comparator arranged to detect when a decaying portion of the sensing signal crosses a threshold to thereby detect the end of the turn off time delay.

Embodiments of the system comprise a controllable signal source to provide a control signal to a control terminal of the power switching device. The system may then be configured to output a said turn off signal to the controllable signal source to turn the signal source off.

Additionally or alternatively the system may comprise a control switch configured as a decoupling switch, and may be configured to output a said turn off signal to the decoupling switch to decouple a control terminal of the power switching device from the controllable signal source, e.g., a source of base current Ib.

There may further be provided the system, comprising a control switch configured as a coupling switch, the system configured to output a said turn off signal to the coupling switch to couple a control terminal of the power switching device to a reference voltage, e.g., ground.

In embodiments of the system the power switching device may be a bipolar junction transistor (BJT) (e.g., in a cascode configuration having the device as a first transistor emitter-switched by a second transistor) or an insulated gate bipolar transistor (IGBT), or may be a FET such as a MOSFET.

An SMPC comprising the switching control system may include a charging circuit for powering a switching controller, the SMPC comprising: a switching circuit comprising first and second transistors, wherein the power switching device is the first transistor and is coupled in series between said input winding and the second transistor and to receive a winding current derived from the input winding. A switching controller controls switching of at least the second transistor; a charge store provides power to the switching controller; and a current diversion circuit conducts a said winding current from the first transistor to the charge store. The second transistor is arranged to controllably decouple a reference voltage from the first transistor to allow the winding current to flow through the current diversion circuit to the charge store.

The SMPC may be, for example, a forward, flyback, buck, boost or buck-boost converter.

According to a related aspect of the present invention, there is provided a switching control system for controlling an on time of a power switching device of a switched mode power converter (SMPC), the on time comprising at least a turn off delay time of the power switching device, the SMPC comprising: an inductive component having a winding coupled to receive power from an input to said SMPC; and a power switching device configured to, when the power switching device is on, conduct current from said winding; the switching control system comprising: at least one output to provide at least one turn off signal to initiate turning off of the power switching device during a switching cycle of the SMPC, a duration of said turning off comprising a turn off time delay; an input to receive a sensing signal from a sensing signal source, the sensing signal source to vary the sensing signal according to switching of the power switching device; and a detection circuit to generate, based on the sensing signal, a decay signal approximating a decaying portion of the sensing signal and having a rate of decay different from a rate of decay of the sensing signal such that the decay signal crosses the decaying portion of the sensing signal, the detection circuit to detect when the decaying portion of the sensing signal crosses said decay signal, to thereby indicate the end of the turn off time delay; and an output to provide an indicator of an on time of the power switching device on the basis of a start time indicator and said indication of said end of the turn off time delay.

According to a further related aspect of the present invention, there is provided a system for indicating an on time of a power switching device of a switch mode power converter (SMPC), the on time comprising at least a turn off delay time of the power switching device, the SMPC comprising: an inductive component having an input winding coupled to receive power from an input to said SMPC; and a power switching device configured to, when on, conduct current of said input winding, the system comprising: means for applying at least one turn off signal, to initiate turning off of the power switching device, said turning off having a duration comprising a turn off time delay of the power switching device; means for detecting decay of a sensing signal from a further winding on the primary side of the inductive component, to thereby indicate an end of said turn off time delay, wherein the further winding is inductively coupled to the input winding, means for indicating a said on time of the power switching device on the basis of a start time indicator and said indication of said end of the said turn off time delay.

According to a still further related aspect of the present invention, there is provided a system for indicating an on time of a power switching device of a switch mode power converter (SMPC), the on time comprising at least a turn off delay time of the power switching device, the SMPC comprising: an inductive component having a winding coupled to receive power from an input to said SMPC; and a power switching device configured to, when the power switching device is on, conduct current from said winding; the system comprising: means for applying at least one turn off signal, to initiate turning off of the power switching device during a switching cycle of the SMPC, a duration of said turning off comprising a turn off time delay; means for obtaining a sensing signal from a sensing signal source, the sensing signal varying according to switching of the power switching device; and means for inputting the sensing signal to a detection circuit to generate, based on the sensing signal, a decay signal approximating a decaying portion of the sensing signal and having a rate of decay different from a rate of decay of the sensing signal such that the decay signal crosses the decaying portion of the sensing signal; means for detecting when the decaying portion of the sensing signal crosses said decay signal, to thereby indicate an end of said turn off time delay; and means for indicating a said on time of the power switching device on the basis of a start time indicator and said indication of said end of said turn off time delay.

The invention further provides processor control code to implement features of the above-described system and control procedures, for example on an embedded processor, e.g., for measuring an exact turn off time delay based on detection inputs and/or controlling element(s). The code may be provided on a carrier such as a disk, CD- or DVD-ROM, programmed memory such as read-only memory (Firmware), or on a data carrier such as an optical or electrical signal carrier. Code (and/or data) to implement embodiments of the invention may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog (Trade Mark) or VHDL (Very high speed integrated circuit Hardware Description Language). As the skilled person will appreciate such code and/or data may be distributed between a plurality of coupled components in communication with one another.

BRIEF DESCRIPTION OF THE DRAWINGS

For a better understanding of the invention and to show how the same may be carried into effect, reference will now be made, by way of example, to the accompanying drawings, in which:

FIG. 20a shows a sensing discriminator for turn-off detection using a signal sampling function, and associated waveforms;

FIG. 20b shows a sensing discriminator for turn-off detection using a signal delay function, and associated waveforms;

FIG. 20e shows a sensing discriminator for turn-off detection using a resettable peak detector function, and associated waveforms;

FIG. 20f shows a sensing discriminator for turn-off detection using a decaying peak detector function, and associated waveforms;

FIG. 21a shows an embodiment of a decaying peak detector with linear decay; and

FIG. 21b shows an embodiment of a decaying peak detector with exponential decay.

DETAILED DESCRIPTION OF PREFERRED EMBODIMENTS

Embodiments provide a number of improvements to bipolar transistor drive for low cost SMPCs. For example, a wide range of transistors may be driven optimally by regulating their turn-off delay time, generally comprising a charge storage time. This is performed in an embodiment using a reliable, low cost approach that requires minimal, preferably no, additional parts for a primary side-sensing flyback converter.

Figure 1:
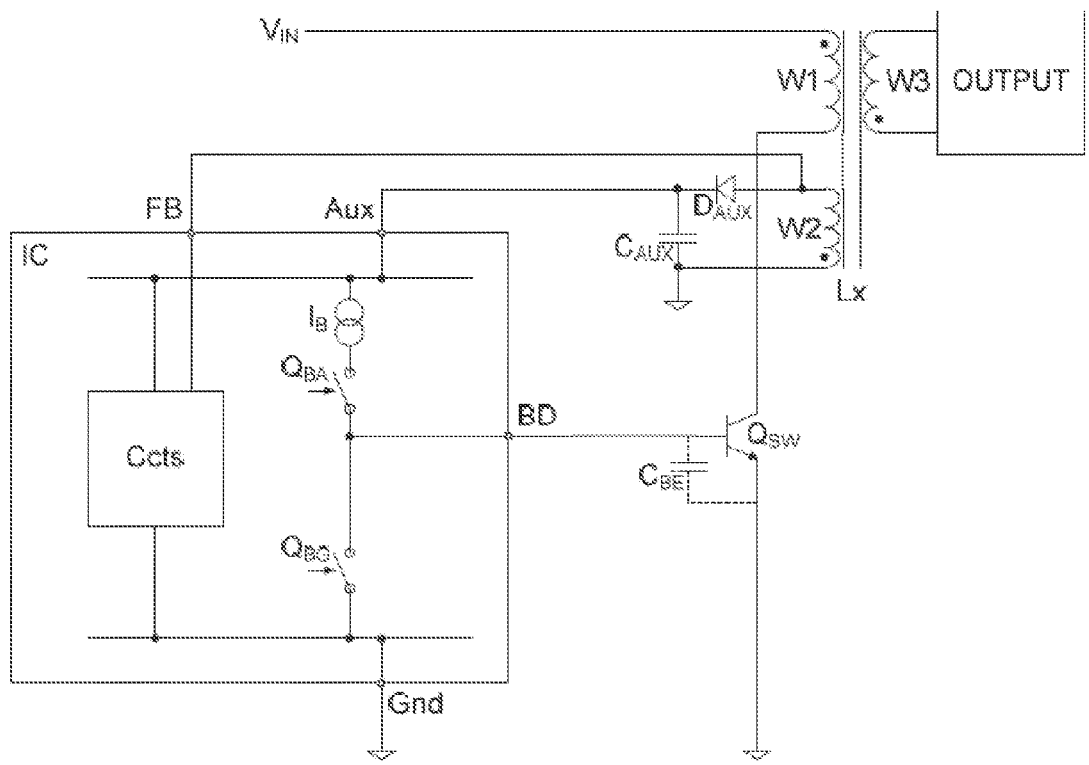
FIG. 1 is a schematic illustration of a first embodiment.
Figure 2:
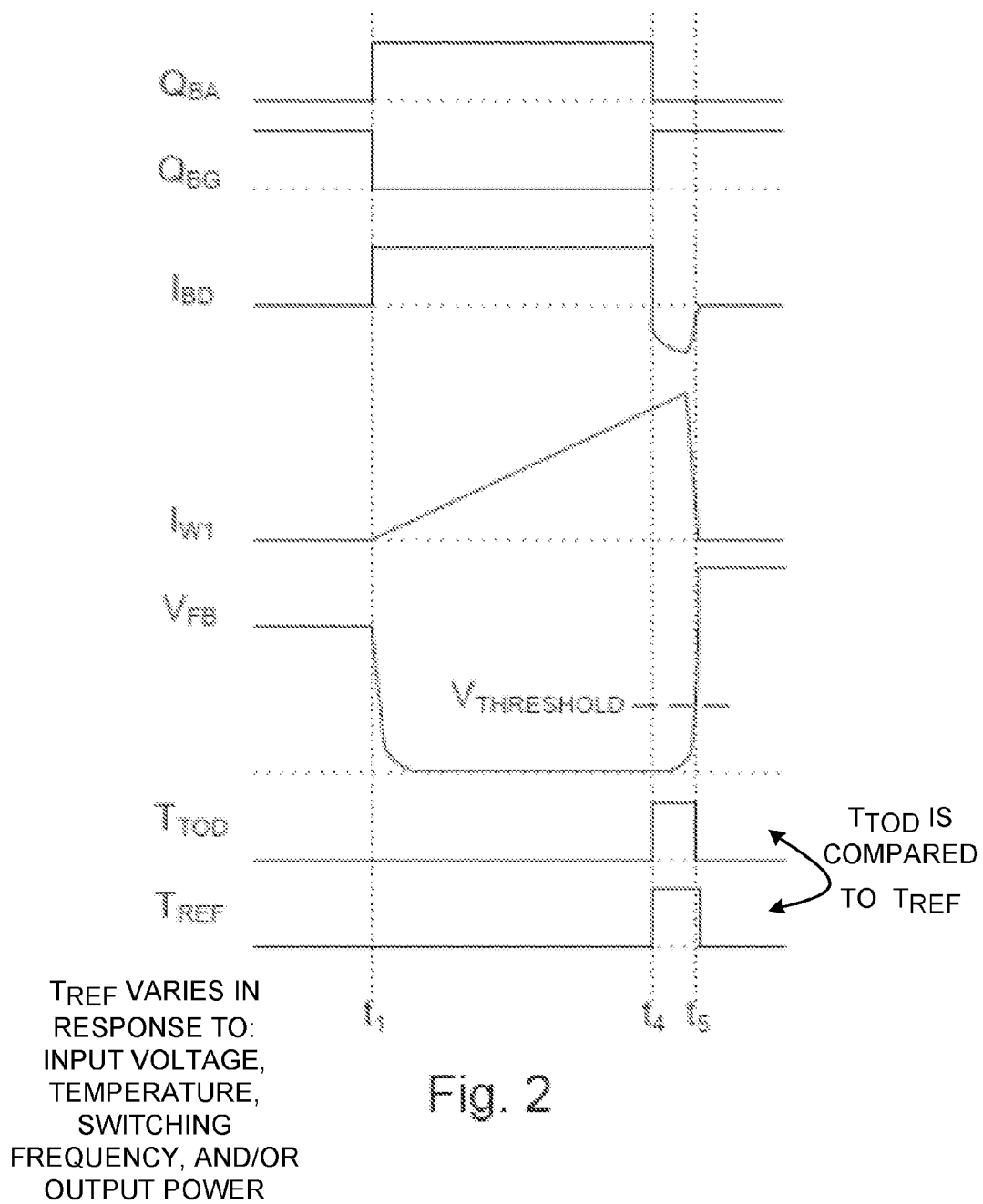
FIG. 2 shows example waveforms of the first embodiment.

One embodiment is shown in FIG. 1, with example waveforms in FIG. 2. The offline switched mode power converter may be of any type, for example flyback, boost or forward converter, and is shown here as a single-ended flyback design. The inductive component Lx illustrated in FIG. 1 is a coupled inductor having windings W1 (input, primary winding), W3 (output, secondary winding) and further winding W2 (preferably a sensing signal source in the form of, e.g., an auxiliary or sense winding). However alternative inductive components Lx may be employed, depending on the converter type and the nature of the application. For example a forward converter may employ a transformer, and a boost converter may employ an inductor. Input voltage VIN may be a DC voltage or a rectified AC voltage, for example rectified mains.

The primary switch $Q_{SW}$ is a power switching device in the form of a bipolar transistor, for example a bipolar junction transistor (BJT), connected in the base-switched configuration. A capacitance $C_{BE}$ is shown between the base and emitter terminals of the BJT $Q_{SW}$ in dashed lines. This represents the sum of the intrinsic charge storage in the BJT and any additional capacitance provided between these terminals. The base terminal of BJT $Q_{SW}$ is connected to a control circuit that, in FIG. 1, is in the form of an integrated circuit, IC. Any of switches $Q_{BA}$ (which may be referred to as a decoupling switch) and $Q_{BG}$ (which may be referred to as a coupling switch), and current source $I_B$ (this may be considered to be a, preferably controllable, source of a device control signal to the base or gate of the power switching device), may be integrated into the IC or may be discrete components. Any of switches $Q_{BA}$ and $Q_{BG}$, and current source $I_B$, may be controlled by turn off signal(s) from circuits comprising circuits ("Ccts"), some or all of which may be integrated into the IC controller. Base current is provided to the BJT $Q_{SW}$ from current source IB, via switch $Q_{BA}$ and IC terminal BD. Switch $Q_{BG}$ may assist in turning off BJT $Q_{SW}$—preferably switch $Q_{BG}$ is controllable to couple the control (base or gate) terminal to a reference voltage such as Gnd. Generally, turning off occurs in the period $t_4$ to $t_5$, which may have a reverse current from the control terminal (e.g., base or gate of the power switching device) as shown for IBD in FIG. 2. In a preferred embodiment switch $Q_{BG}$ is coupled between the base terminal of the BJT and a negative reference voltage. This provides a larger potential difference to increase the rate of removal of charge from the BJT base terminal. However in many SMPCs a negative reference voltage is not conveniently available. Instead, as illustrated in FIG. 1, switch QBG may be coupled between the base terminal of the BJT and a reference low voltage, for example ground (Gnd). By appropriate control of switches $Q_{BA}$ and $Q_{BG}$, and of current source $I_B$, BJT $Q_{SW}$ may be controlled to switch power from $V_{IN}$ through the input winding W1 to a reference voltage, shown as Gnd in FIG. 1.

Preferably, bias power may be provided to the IC in FIG. 1 from auxiliary winding W2, via rectifier $D_{AUX}$ and IC terminal Aux.

In FIG. 1 the unrectified signal from low voltage auxiliary winding W2 is detected at feedback IC terminal FB (noting that FB may be an input within or to switching control system comprising the Ccts preferably in the form of an IC; the system may further comprise an output internal or external to Ccts, the output line being use to indicate an on time). Alternatively another low voltage primary side winding, such as a sense winding (not shown), may be used instead of auxiliary winding W2. Other components, e.g. resistor(s) and/or a resistive divider, may be connected between W2 and the FB terminal to ensure that the voltage and current amplitudes of the signal at the FB terminal are appropriate. The FB signal may be processed by any suitable circuits within the IC, for example to reverse the polarity of negative-going signals, and/or to adjust the input impedance of the FB terminal, and/or to further adjust the amplitude of FB signals.

The signal at the FB terminal of the IC in FIG. 1 may be used to sense the voltage across the output winding W3 of the coupled inductor Lx, for example as described in U.S. Ser. No. 11/445,473, U.S. Ser. No. 12/405,618 and U.S. Ser. No. 12/752,611 hereby incorporated in their entirety by reference. Such sensing, referred to as 'primary side sensing', is performed whilst the output winding W3 is conducting current and the primary switch $Q_{SW}$ is open. However the signal at the FB terminal may also be used to indirectly sense the voltage across the high voltage input winding W1 to which $Q_{SW}$ is connected. This may advantageously avoid the cost, space, additional sensing input, and/or power dissipation of high voltage parts that are required to directly measure the high voltage across the input winding. An embodiment employs this indirect measurement technique to detect the rise in $Q_{SW}$ collector voltage as switch $Q_{SW}$ turns off.

An illustration of operation of such an embodiment is provided in the waveforms of FIG. 2 and refers to features of the schematic illustration of FIG. 1. An on time of the device of FIG. 2 may be represented by, e.g., $t_1$-$t_5$ or $t_4$-$t_5$.

A switching cycle generally comprises an on period and immediately preceding and following off periods of the power switching device. For example, a first switching cycle may be considered to extend for example from $t_1$ through $t_4$ and $t_5$ and through a period ending with a following $t_1$ (not shown) of a second switching cycle. Alternatively, a first switching cycle may be considered to extend for example from $t_5$ through a following $t_1$ and $t_4$ (neither shown) and through a period ending with a following $t_5$ (not shown) of a second switching cycle. More generally, the start and end of a switching cycle may be considered to be when consecutive instances of a turn off signal(s) being applied, or consecutive instances of a turn on signal(s) being applied for turning on the power switching device. Alternatively, the start and end of a switching cycle may be considered to be when consecutive instances of start of flow of one of the control terminal current (e.g., $I_{BD}$), conduction terminal (e.g., collector, emitter, source or drain terminal) current or winding current (e.g., $I_{W1}$), or a corresponding change in the sensing signal (e.g., $V_{FB}$). Alternatively, the start and end of a switching cycle may be considered to be when consecutive instances of end of flow of one of the control terminal current (e.g., $I_{BD}$), conduction terminal (e.g., collector, emitter, source or drain terminal) current or winding current (e.g., $I_{W1}$), or a corresponding change in the sensing signal (e.g., $V_{FB}$).

In FIG. 2, the waveforms $Q_{BA}$ and $Q_{BG}$ illustrate the logic states of those switches, with the higher level representing a switch on (closed) state and the lower level representing a switch off (open) state. At time $t_1$ switch $Q_{BA}$ is closed, switch $Q_{BG}$ is opened, and current source $I_B$ is turned on, providing base current $I_{BD}$ out of IC terminal BD. In this example base current from current source $I_B$ is held at a constant value while switch $Q_{BA}$ is closed. Turn-on of BJT $Q_{SW}$ is initiated, causing current $I_{W1}$ to begin to flow through primary winding W1 of the coupled inductor to Gnd. In the flyback converter of FIG. 1 the W1 current takes the form of a linear ramp, as shown in the $I_{W1}$ waveform of FIG. 2. The sensing signal, in this embodiment feedback signal $V_{FB}$, reflects the rapid change in voltage across the primary winding W1, and hence across the collector-emitter terminals of BJT $Q_{SW}$.

At time $t_4$ switch $Q_{BA}$ is opened, switch $Q_{BG}$ is closed, and current source $I_B$ is turned off. However stored charge allows BJT $Q_{SW}$ to continue to conduct winding current $I_{W1}$; this stored charge is primarily removed via the base terminal and $Q_{BG}$ between times $t_4$ and $t_5$, as shown by the negative lobe of base current $I_{BD}$. Because the saturation of $Q_{SW}$ has been carefully controlled (see below), this reverse base current flow $I_{BD}$ is typically short-lived; it is arranged that only a limited stored charge remains at time $t_4$ and this is quickly removed by the large negative base current. Switch $Q_{BG}$ provides a low impedance to this 'reverse base current' and asserts a reliable turn-off when BJT $Q_{SW}$ opens at time $t_5$. In this example, the turn-off delay time, $T_{TOD}$ is the period from $t_4$ to $t_5$, ending when the BJT $Q_{SW}$ actually turns off. More generally, the turn-off delay time may in an embodiment be the storage time or may also include the fall time (time taken for the collector current to fall below some threshold). Nevertheless, the events used to define the start and end of this turn-off delay time may be chosen according to the sensed signals available and the particulars of the drive scheme. For example the turn-off delay time may be defined to start when positive base drive current is removed or when negative base current flow begins. Although these two events are essentially simultaneous in the drive scheme illustrated in FIG. 2, they may occur separately—as discussed below. The start of the turn-off delay time, $t_4$, may for example therefore be identified with a level change in a signal sent to switches $Q_{BG}$ or $Q_{BA}$, or by directly sensing the onset of reverse base current. The end of the turn-off delay time, $t_5$, may in general be detected in the crossing of a threshold value by the current through, or voltage upon, any of the BJT terminals. For example $t_5$ may be detected as a rise in $Q_{SW}$ collector voltage, a fall in $Q_{SW}$ collector current or a fall in negative base current $I_{BD}$. Preferably the end of the turn-off delay time, $t_5$, is detected using the feedback signal $V_{FB}$.

Measurement of turn-off delay time may be achieved by any appropriate means, for example by charging a timing capacitor, by counting clock pulses or by comparison to a reference time interval (e.g. target time value $T_{REF}$).

The duration of the turn-off delay time $T_{TOD}$ may be controlled to a desired value $T_{REF}$: If the turn-off delay time in a switching cycle is measured, the amplitude(s) and/or duration(s) of the base drive current pulses may be altered accordingly in subsequent switching cycle(s). For example, if the measured turn-off delay time $T_{TOD}$ is shorter than a reference desired time $T_{REF}$, it may be increased in a subsequent switching cycle by increasing the amplitude and/or duration of the base current pulse used to cause transistor conduction. This ensures that BJT $Q_{SW}$ operation is optimal and most efficient in changing load conditions and/or variations in $V_{IN}$, and for a wide range of BJTs. In the example of FIG. 2 the $T_{TOD}$ signal goes high when switch $Q_{BG}$ is closed at $t_4$ and goes low when $V_{FB}$ crosses a threshold voltage $V_{THRESHOLD}$ at $t_5$.

Generally speaking, a shorter turn-off delay time may (a) reduce base current requirements and wastage, thereby reducing power dissipation, and/or (b) reduce turn-off time, and/or may reduce turn-off switching losses in the BJT. However, if the target turn-off delay time is too short BJT conduction losses may be increased, as the saturation voltage $V_{CE}$ rises prior to time $t_5$. Optimal turn-off delay time depends on particulars of the input voltage, converter and the load. In offline flyback converters of around 5-10 W rated output power, for example, a target turn-off delay time of around 100-250 ns may provide optimum operation. The target and/or measured turn-off delay time may include some means of correcting for delays in the sensing, processing or signal generation functions of the control circuits. Some experimentation in different operating conditions may be required to select the desired target turn-off delay time for optimum results in a particular power converter. Further, improved efficiency may be achieved by adapting the target turn off delay time to the peak collector current e.g., a) shorter (or longer) turn off time when the peak current is high and/or b) longer turn off time when the input voltage is low.

A further advantage of measuring turn-off delay time is that it may allow some fault conditions, for example those causing deep saturation of the BJT, or premature desaturation, to be rapidly detected.

Desaturation Protection

When using a BJT or an IGBT as a switching device it is important to keep the switching device saturated until the turn off signal is applied. If this is not the case (premature desaturation) then the voltage across the switching device will rise. The switching device enters a state of high current and high voltage. The consequence is a rapid increase of power loss in the switching device. This will reduce the efficiency of the SMPC and can lead to the destruction of the switching device because of over-heating.

The rise in the voltage across the switching device triggers turn off detection. A premature desaturation is detected if turn off is detected before the turn off signal is applied.

Premature desaturation will happen if the amount of charge delivered to the control terminal of the switching device is insufficient to support the conduction of switching device. For example this could be the case if a BJT current gain is too low or before the turn off time delay has reached the target time value when the SMPC experiences a load transient.

To protect the switching device the SMPC should immediately apply the turn off signal when premature desaturation is detected. Applying the turn off signal immediately reduces the time the switching device spends in a state of high current and high voltage. This reduces the power loss in the switching device. Alternatively, the control signal (base current, gate voltage) may be increased immediately so the transistor can support the conduction current within the switching cycle.

To protect against premature desaturation in subsequent switching cycles the SMPC could increase the amount of charge delivered to the switching device. Also the current demand per switching cycle could be reduced by changing the operating conditions. For example an increase in the switching frequency or a reduction in the output power reduces the current demand per switching cycle. Then the SMPC can continue operating in normal mode.

In some cases the premature desaturation persists. Then the SMPC can enter a protective mode to further protect the switching device. The protective mode could operate the SMPC at low duty to test if the abnormal conditions have ceased or shutting down the SMPC indefinitely.

Continuing now to describe the figures, when switch $Q_{SW}$ desaturates near the end of the turn-off delay time, the $Q_{SW}$ collector-emitter voltage $V_{CE}$ and hence the feedback signal voltage $V_{FB}$ rise rapidly. This $V_{FB}$ transition, and hence the end of the turn-off delay time, can be detected by any appropriate means. For example, the crossing of a suitable threshold value $V_{THRESHOLD}$ by the feedback signal voltage $V_{FB}$ may be detected. This may be performed, for example, by a comparator. However due to the characteristics of the coupling of the feedback signal to the IC, the most appropriate threshold voltage may differ according to the particulars of the converter, BJT, base drive scheme, load, and other operating conditions such as (particularly) input voltage. This is because the minimum in $V_{FB}$ generally depends on at least these variables.

Improved sensing of the end of the turn-off delay time, $t_5$, can be obtained by detecting a relative change in the feedback signal voltage from its value when the switch is closed (i.e. between t1 and t4 in FIG. 2). This approach may reduce variability compared to a simple voltage threshold technique. A threshold change in the feedback signal voltage may be conveniently detected in a number of ways. For example a decaying peak detector may be used, or a non-linear decaying peak detector, as described in U.S. patent application Ser. No. 12/752,611 hereby incorporated by reference in its entirety. Such arrangements may enable re-use of circuits and components used to indirectly sense the voltage across the output winding W3. Further detail of a non-linear decaying peak detector, so-termed due to an absence of switches, is given in the following.

Figure 3:
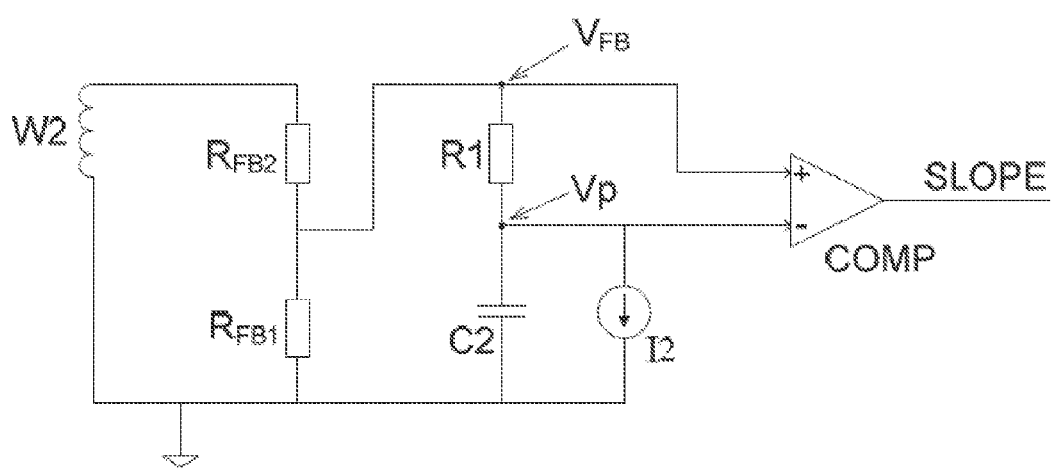
FIG. 3 is a schematic illustration of a $V_{FB}$ signal change detector embodiment.

Referring to the schematic circuit diagram of FIG. 3 showing a detection/detector circuit, this circuit embodiment allows a change in the $V_{FB}$ signal to be detected but generally avoids the use of any switches or diodes of a conventional decaying peak detector. This is advantageous because such components may introduce noise into the system. However modifications to the circuit, for example in which one or more switches are retained, are possible and may provide some advantages over the circuit illustrated in FIG. 3. As shown in FIG. 3, the circuit may comprise a signal follower comprising for example R1 and C2, and a comparator COMP. Optionally (not shown) there may be provided signal buffering and conditioning between W2 and the point marked $V_{FB}$.

The absence of switches and diodes modifies the behaviour of this circuit from that of a linear decaying peak detector. For example, the decay signal Vp can decay faster than a linear decaying peak detector's decaying signal when $V_{FB}$ is smaller than Vp. This is possible because current can flow through coupling circuitry such as resistor R1 to the auxiliary winding W2 as well as from it. Nonetheless this circuit still retains the main characteristics of a decaying peak. One advantage is that the turn-off point detector recovers faster from large voltage transients, such as that at $Q_{SW}$ turn-on.

The operation of the non-linear decaying peak detector circuit embodiment can be described as follows. The sensing signal waveform $V_{FB}$ is acquired from the auxiliary (or other) winding W2, optionally via a potential divider ($R_{FB2}$, $R_{FB1}$) and/or other intermediate circuits such as clamps, buffers and the like (not shown). Additional intermediate circuits may reverse the polarity of negative-going $V_{FB}$ signals. $V_{FB}$ is applied to the non-inverting input of the comparator COMP. Capacitor C2 and current source I2 (preferably a constant current generator) create a decay signal at a node identified by voltage Vp. This decay signal approximates decaying portions of the sensing signal waveform $V_{FB}$. Comparator COMP is triggered when the current through resistor R1 is equal to zero. Therefore COMP detects when $V_{FB}$ becomes smaller than Vp and when $V_{FB}$ becomes larger than Vp. The relative size of $V_{FB}$ and Vp is therefore indicated by the value of SLOPE (otherwise referred to as 'peak'), the output of COMP. Thus, in the present embodiment, a change of SLOPE may be considered to be an indication of the end of a turn off time delay.

Figure 4:
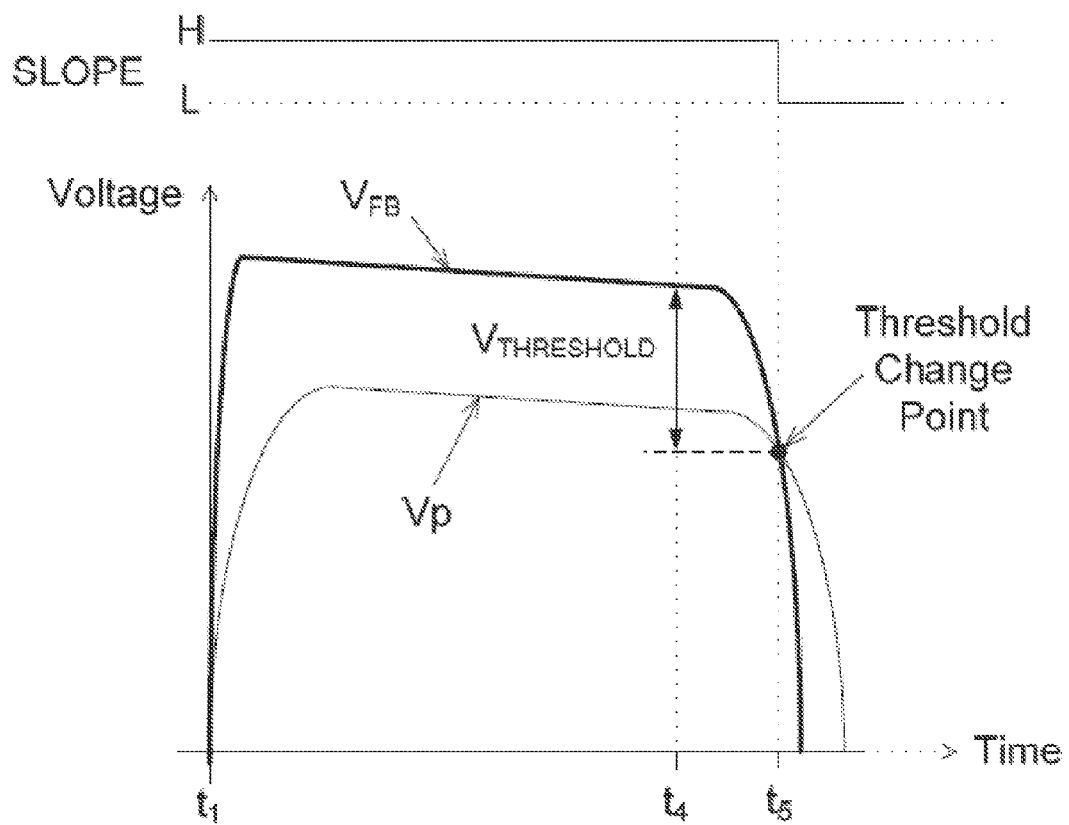
FIG. 4 illustrates example waveforms for the $V_{FB}$ signal change detector embodiment.

An interesting property of this circuit embodiment and its analogues is the rate of change of decay signal Vp, which depends on the $R_1C_2$ time constant. The $V_P$ rate of change is preferably lower than that of sensing signal $V_{FB}$, but fast enough for the $V_P$ signal to settle between $t_1$ and $t_4$. The point of interest in $V_{FB}$ is that indicating a threshold change from its value when the switch $Q_{SW}$ is closed. This is shown in FIG. 4's illustrative circuit waveforms (The precise form of the waveforms of FIG. 4 depend on circuit component values). Note that the polarity of the $V_{FB}$ signal has been reversed from that in FIG. 2.

As previously explained, the threshold change point occurs when the feedback signal voltage $V_{FB}$ deviates by an amount $V_{THRESHOLD}$ from its value when the switch is closed. Towards the end of the switch $Q_{SW}$ on-time $t_4$, $V_{FB}$ is positive and changes slowly in time. Resistor $R_1$ ensures that there is a potential difference between sensing signal $V_{FB}$ and decay signal Vp before the switch begins to turn off. The amplitude of sensing signal waveform $V_{FB}$ begins to decrease rapidly as the turn-off process progresses and, since it falls faster than decay signal Vp, the two signals become equal at a crossing, or threshold change, point. This triggers the comparator COMP, which changes state from High to Low. At this threshold change point the sensing signal $V_{FB}$ has changed by an amount $V_{THRESHOLD}$ from its value when the switch was closed (i.e. fully on). This corresponds to a change in the $Q_{SW}$ collector voltage, which is the quantity that that is being indirectly sensed. Beyond the threshold change point the sensing signal $V_{FB}$ falls faster than the decay signal Vp and departs from that signal.

Figure 5:
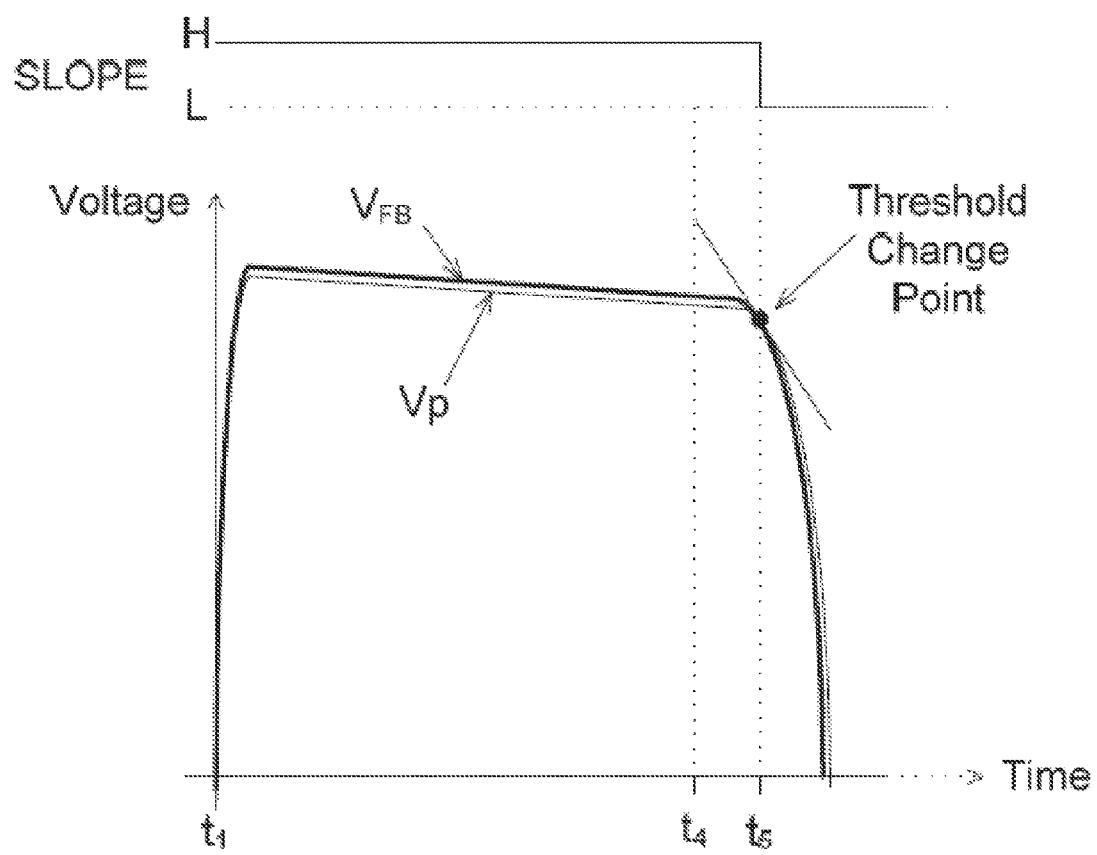
FIG. 5 shows example waveforms for a "knee-point" $V_{FB}$ signal change detector embodiment.

Various parameters can be adjusted to ensure accurate and/or robust operation of the circuit. For example the rate of the decay signal $V_P$ can be set by choosing appropriate values of resistor R1 and capacitor C2. As another example, the potential difference between $V_{FB}$ and $V_P$ can be set by resistor $R_1$ and current source $I_2$. A smaller current $I_2$ produces a smaller potential difference between sensing signal $V_{FB}$ and decay signal $V_P$, as shown in FIG. 5. This enables an earlier response to the rapid fall of $V_{FB}$ when the switch turns off for a given setting of the decay signal $V_P$, but also increases susceptibility to noise in the sensing signal $V_{FB}$.

By adjusting these parameters a suitable value of $V_{THRESHOLD}$ may be chosen, corresponding to a desired threshold change in the collector voltage of switch $Q_{SW}$. The optimum choice of this $Q_{SW}$ collector voltage change depends on a number of factors, including SMPC type, $Q_{SW}$ switching mode, etc. As an example, for a flyback converter of around 5 W rated power, a collector voltage change of 20 V in 150 ns may provide reliable performance.

In FIG. 3 components capacitor C2 and current source I2 are shown as having fixed values. A resistor $R_2$ may be used in parallel to or as a replacement for the current source $I_2$. Furthermore either or both of $C_2$ and $I_2$ (or $R_2$) may be trimmable after semiconductor processing to provide reduced variation over the manufacturing process. This can provide a more consistent determination of the turn-off point across a wafer of ICs or within, or between, wafer batches.

Implementations of the circuit of FIG. 3 preferably use a decay signal of slower decay than a sensing signal to detect the turn-off point of BJT $Q_{SW}$. Embodiments also provide a decaying peak detector with variable decay rate dependent on input signal amplitude. Embodiments may provide efficient use of silicon area and/or compare favourably with those making direct measurement of the $Q_{SW}$ collector voltage.

An alternative approach, using the same circuit as shown in FIG. 3, is to detect a threshold in the rate-of-change (the "knee-point") rather than a voltage threshold. Then the size of the $R_1$ resistor is reduced so the $V_P$ signal closely tracks the $V_{FB}$ signal. The comparator will detect when the rate of change in $V_{FB}$ is so large that $C_2 dV_{FB}/dt > I_2$. The effects of the offset and delay will be of second order to the rate-of-change because the $R_1C_2$ delay and the $R_1I_2$ offset are small. This is shown in FIG. 5's illustrative circuit waveforms. However, noise sensitivity may be increased in such an embodiment.

Due to noise and ringing components in the sensing signal $V_{FB}$ there may be more than one crossing point whilst the switch is on. If all crossing points of the sensing signal $V_{FB}$ and decay signal Vp during the $Q_{SW}$ on-time are detected, then the turn-off point may be identified as the last instance of $V_{FB}$ decaying below the value of Vp prior to the feedback signal falling to zero or some other predefined value. An alternative strategy is to detect the last transition occurring within a pre-determined delay from application of the turn-off signal.

It is possible to combine the peak detector for the W1 transition (switch turn-off) and the W3 transition (end of output winding current flow). It may be preferable to dynamically set different values for R1, C2 and I2 for optimum sensing of the two transitions. Also the polarity may be reversed for the detection points and/or some sort of rectification of the $V_{FB}$ signal may be provided by the intermediate circuits.

Figure 6:
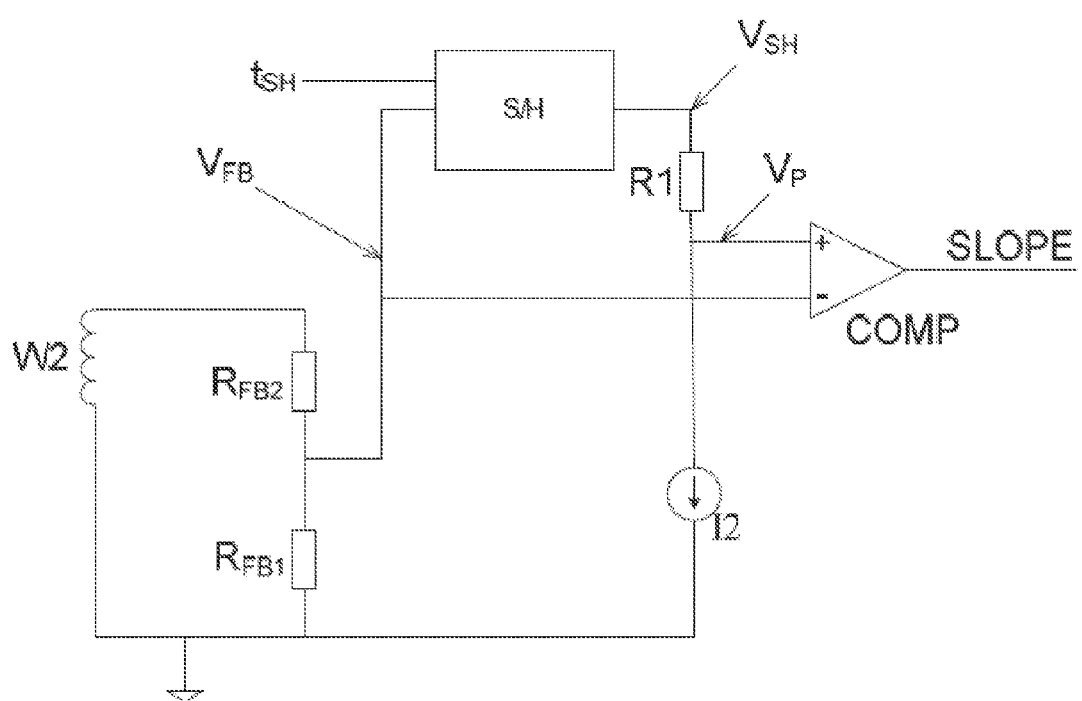
FIG. 6 is a schematic of a S/H $V_{FB}$ signal change detector embodiment.
Figure 7:
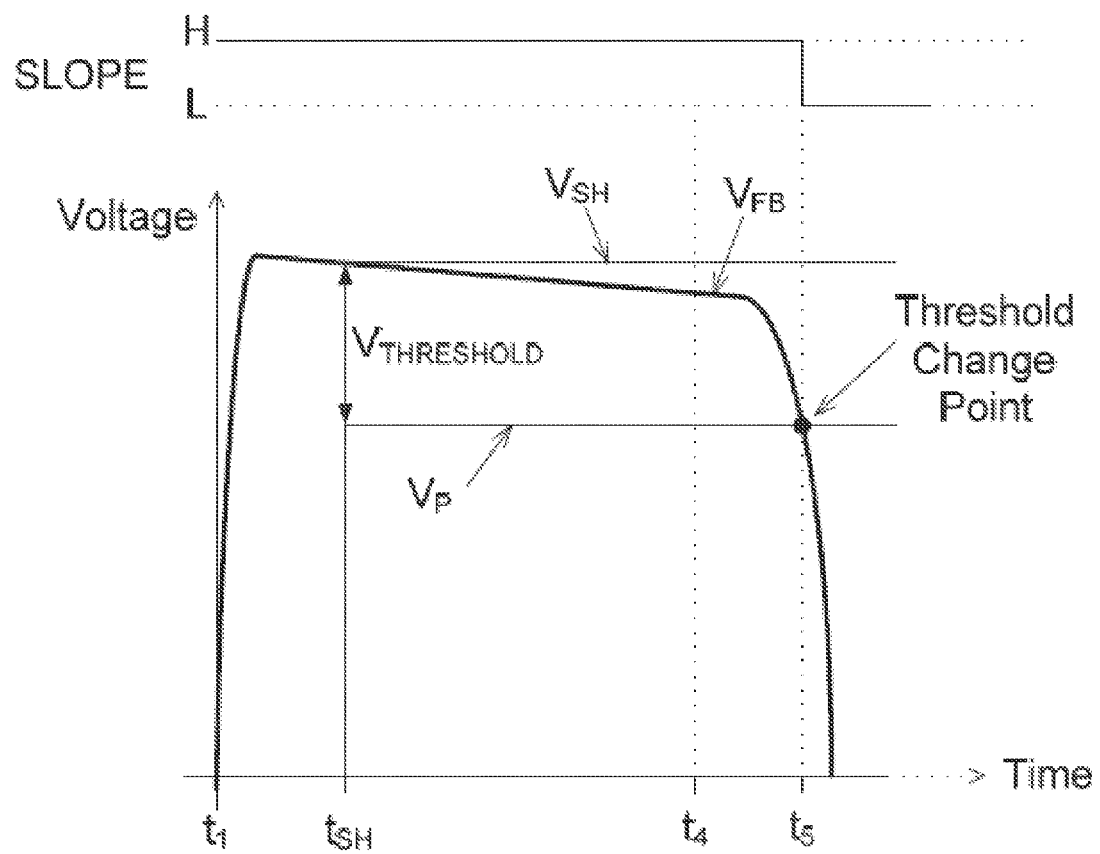
FIG. 7 shows example waveforms for a S/H $V_{FB}$ signal change detector embodiment.

Another embodiment of the $t_5$ detection can use a sample-and-hold circuit where the sensing signal $V_{FB}$ is sampled some time after $t_1$. The sampling time point $t_{SH}$ is preferably chosen between $t_1$ and $t_4$, where the sensing signal $V_{FB}$ has settled. The $t_5$ point is detected when the sensing signal $V_{FB}$ deviates by an amount $V_{THRESHOLD}$ from its sampled value. It may be better to sample close to the $t_4$ time so the droop on $V_{FB}$ is eliminated from the threshold change detection. Otherwise the $V_{FB}$ droop between $t_{SH}$ and $t_4$ must be considered when selecting the $V_{THRESHOLD}$ value. An embodiment using a sample-and-hold circuit is shown in FIG. 6 having the output SLOPE (otherwise referred to as 'peak'), example waveforms of which are shown in FIG. 7.

Considering peak detection more generally, peak detectors that may be used in an embodiment for improved sensing of the end of the turn-off delay time may be of the types shown in FIG. 14 (wherein the output 'peak' of each peak detector may otherwise be referred to as 'SLOPE'). Specifically, FIG. 14a shows a relatively simple peak detector example, which will hold the peak value indefinitely. The $V_P$ sample voltage must be reset in order to catch smaller peaks later. FIG. 14b shows an example leaky peak detector, wherein the sampled peak value $V_P$ is allowed to leak away to catch smaller peaks later. FIG. 14c shows a non-linear peak detector, which generally catches all peaks, big or small. FIG. 14d shows example waveforms of these types of peak detector for comparison, wherein the peak is detected on the falling edge of the peak signal on the comparator output.

More complex switching schemes may offer improved BJT operation in some applications and for some converter types. Another example scheme is illustrated in the waveforms of FIG. 8, wherein $I_{BD}$ is a device control signal having a first amplitude between $t_1$ and $t_2$ and a second amplitude between $t_2$ and $t_3$.

Figure 8:
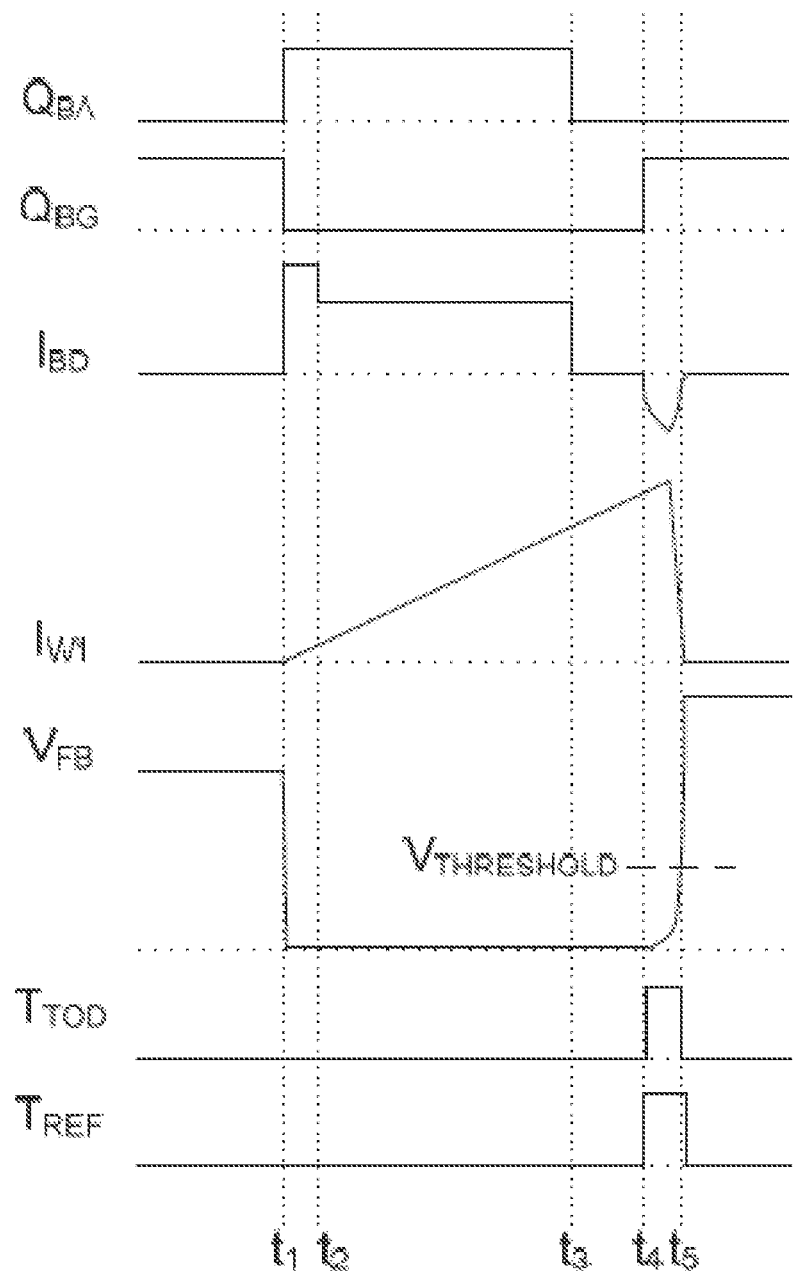
FIG. 8 shows alternative example waveforms.

The alternative switching scheme of FIG. 8 is very similar to that of FIG. 2, but some interesting differences are noted in the following. The current source $I_B$ is initially set to a high level until time $t_2$, ensuring that the BJT $Q_{SW}$ quickly reaches a desired state of saturation. Preferably, for high frequency switching applications, deep saturation is avoided since it leads to excessive stored charge and a prolonged turn-off time. A preferred approach is to employ 'quasi-saturation', in which an appropriate balance of on-state and switching losses is reached. The amplitude and/or duration of the initial current level may be fixed or made dependent on some variable or parameter. For example, the amplitude and/or duration of the high initial current level may be modulated according to power on the input or output of the SMPC, e.g., may be modulated by the amplitude of the load current on the converter output, or it may be made dependent on a parameter relating to demand. Additionally or alternatively it may be scaled according to input voltage $V_{IN}$. As the required degree of saturation is reached the BJT collector-emitter voltage $V_{CE}$ quickly attains an acceptably low level. Such a fast turn-on may be useful for example in converter topologies featuring high $Q_{SW}$ current early in the switch on-time, such as the forward converter or the continuous conduction mode flyback or boost converter.

In this embodiment, from time $t_2$ until $t_3$ the current source $I_B$ output is reduced to a lower level, intended to maintain the BJT $Q_{SW}$ in conduction until the point at which it turns off at $t_5$, following a turn-off delay time $T_{TOD}$ equal to $T_{REF}$. The amplitude and/or duration of this current level may be made variable. Although illustrated as a single pulse of constant amplitude in FIG. 8, the base drive current produced from time $t_2$ to $t_3$ may vary in amplitude and time. For example its amplitude may be made to depend on the BJT emitter or collector current flowing, providing 'proportional base drive'. It may additionally or alternatively comprise any number of pulses which may modulate the $Q_{SW}$ base current in a PWM or PFM manner. Examples of suitable base drive current schemes are described in, for example, PCT/GB2008/050299 and PCT/GB2008/050300 hereby incorporate by reference in their entirety.

From time $t_3$ until $t_4$ the current source $I_B$ is turned off and switch $Q_{BA}$ is opened. Switch $Q_{BG}$ may, as shown in FIG. 8, remain open during this period, substantially preventing base current flow. The $Q_{SW}$ base terminal voltage is determined by the base-emitter junction charge, and is typically around 0.5 V higher than the emitter terminal voltage. In this period, the charge stored on the base sustains transistor conduction; sufficient charge applied to the base in the interval $t_1$ to $t_3$ supports the total collector current flow until time $t_5$. Current $I_{W1}$ through winding W1 continues to ramp and transistor conduction maintains BJT collector-emitter voltage $V_{CE}$ at a low level. The 'open base' period between times $t_3$ and $t_4$ may allow charge carriers in the base to recombine and prevent current focussing at the emitter.

At time $t_4$ switch $Q_{BG}$ is closed, forcing collector current to flow out primarily through the base terminal of $Q_{SW}$ to Gnd. Hence in the example switching scheme of FIG. 8, the start of the turn-off delay time has been chosen as the onset of reverse base current, rather than the cessation of forward base current. In the example of FIG. 8 the 'open base' period between times $t_3$ and $t_4$ reduces the amount of stored charge compared to that of FIG. 2, hence there is a shorter duration of reverse base current between times $t_4$ and $t_5$. This may allow a shorter target turn-off delay time to be employed.

Although the illustration of FIG. 1 shows a base-switched common emitter BJT, principles of the embodiment are applicable to other drive topologies. A preferred solution is illustrated schematically in FIG. 9 comprising a first power transistor in the form of power switching device $Q_{SW}$ and a second transistor in the form of switch $Q_{EG}$. The offline power converter may again be of any type, but a flyback converter has been illustrated to aid comparisons with FIG. 1, FIG. 2 and FIG. 8.

Figure 9:
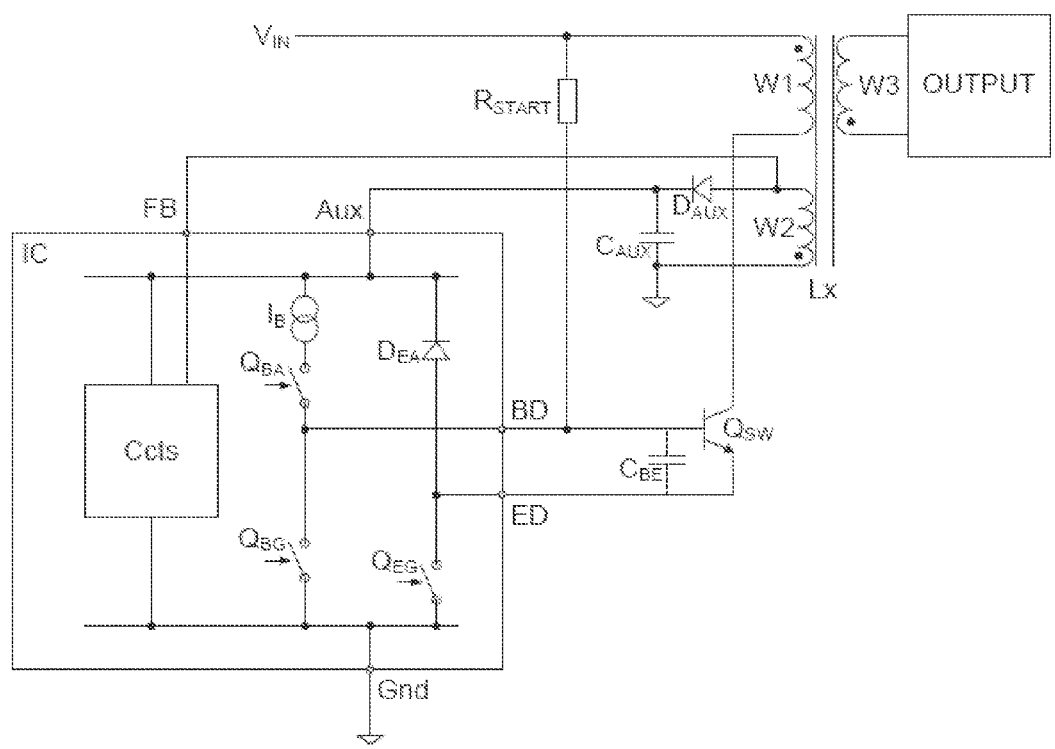
FIG. 9 is a schematic illustration of an alternative embodiment.

Some or all of switches $Q_{BA}$, $Q_{BG}$ and $Q_{EG}$, diode $D_{EA}$, and current source $I_B$, may be integrated into an IC Controller, as illustrated in FIG. 9. This approach may minimise the overall parts count for a power converter. Alternatively some or all of these devices may be discrete components, for example in order to reduce power dissipation in, and/or the die size of, the IC. Alternatively more parts, particularly $Q_{SW}$, may be integrated into a single IC. They may be formed in any appropriate manufacturing process. A conduction path in the form of, e.g., the connection between the ED and Aux terminals, may be provided by a controllable switch $Q_{EA}$ rather than by diode (or switch) $D_{EA}$. Switches $Q_{BA}$, $Q_{BG}$ and/or $Q_{EG}$ (and $Q_{EA}$ if present) may be controlled by circuits comprising circuits ("Ccts"), some or all of which may be integrated into the IC controller. Alternatively any or all of the control circuits, including current source $I_B$, may be embodied as discrete components. FIG. 9 may be described as having a charging circuit comprising at least $Q_{EG}$, $D_{EA}$ (or a switch in place of $D_{EA}$) and/or $C_{AUX}$, the charging circuit for powering a switching controller such as Ccts, the switching controller for example to control any one or more of the switches shown in FIG. 9 including Qsw, $Q_{BA}$, etc., wherein $Q_{SW}$ and $Q_{EG}$ form first and second transistors of a switching circuit and a current diversion circuit comprises at least DEA (which may be replaced by a further switch).

The primary switch $Q_{SW}$ is a bipolar transistor, for example a bipolar junction transistor (BJT), connected in the cascode, or emitter-switched, configuration. $Q_{EG}$ is a low voltage, high current switch on the IC (or provided discretely), controlling $Q_{SW}$ emitter current to a reference voltage, here chosen to be 0 V (Gnd). Among the advantages of employing the cascode arrangement are: fast switching—both on and off—due to $Q_{EG}$ being a fast, low voltage device; high voltage withstanding capability with an advantageous reverse-bias safe operating area (RBSOA); and/or low no-load power consumption due to the ability to use the gain of $Q_{SW}$ to pass start-up current. At start-up, a small current from $V_{IN}$ through start-up resistor $R_{START}$ causes the $Q_{SW}$ base voltage to rise, biasing $Q_{SW}$ to conduct collector-emitter current. This current, which is larger than the base current flowing through $R_{START}$ by a factor of the $Q_{SW}$ gain, flows via diode $D_{EA}$ to the IC's charge reservoir $C_{AUX}$ (since switches $Q_{BA}$, $Q_{BG}$ and $Q_{EG}$ are open). $R_{START}$ may thus be chosen to have a relatively large value, for example around 40 MΩ, allowing power dissipation in $R_{START}$ to be reduced. Thus, a charge store of an embodiment comprises capacitor $C_{AUX}$ and/or may be used to provide power to control switching of one or more switching devices such as $Q_{SW}$, $Q_{BA}$, $Q_{BG}$, $Q_{EG}$ and/or any form of switch used to control $I_B$.

The base terminal of a BJT in a cascode configuration is, in the prior art, typically biased to a DC voltage to ensure conduction when the emitter switch is closed. The present embodiment instead employs switching of the $Q_{SW}$ base terminal to more precisely control operation of the BJT: The $Q_{SW}$ base terminal is connected to a low reference voltage, chosen to be Gnd in FIG. 9, via switch $Q_{BG}$. The $Q_{SW}$ base terminal is also connected to a source of current $I_B$ via switch $Q_{BA}$. $I_B$ may be an active current source or simply a resistor connected to a voltage source, such as the Aux rail.

This switched base and emitter approach may retain the reliability advantage of open emitter switching inherent to a cascode arrangement but also limiting the peak voltage excursion of the emitter during turn off. With the emitter terminal open there is substantially no opportunity for current gain in the BJT provided that the peak emitter voltage does not cause any current flow into connected circuits (e.g. $D_{EA}$). Without opportunity for emitter current flow, the BJT can withstand higher collector voltages during and immediately following turn-off without adverse breakdown that could degrade power efficiency and reliability. The practical result is that, with appropriate switch control in an embodiment, the BJT's applicable breakdown voltage may be higher in this configuration compared to configurations that are only base-switched. This may add a cost advantage to the base- and emitter-switched arrangement.

By appropriate control of switches $Q_{EG}$, $Q_{BG}$ and $Q_{BA}$ and of current source $I_B$ a wide range of BJT control techniques may be implemented. The alternative switching scheme of FIG. 8 may be modified for use in the switched base and emitter arrangement of FIG. 9, as illustrated in FIG. 10.

Figure 10:
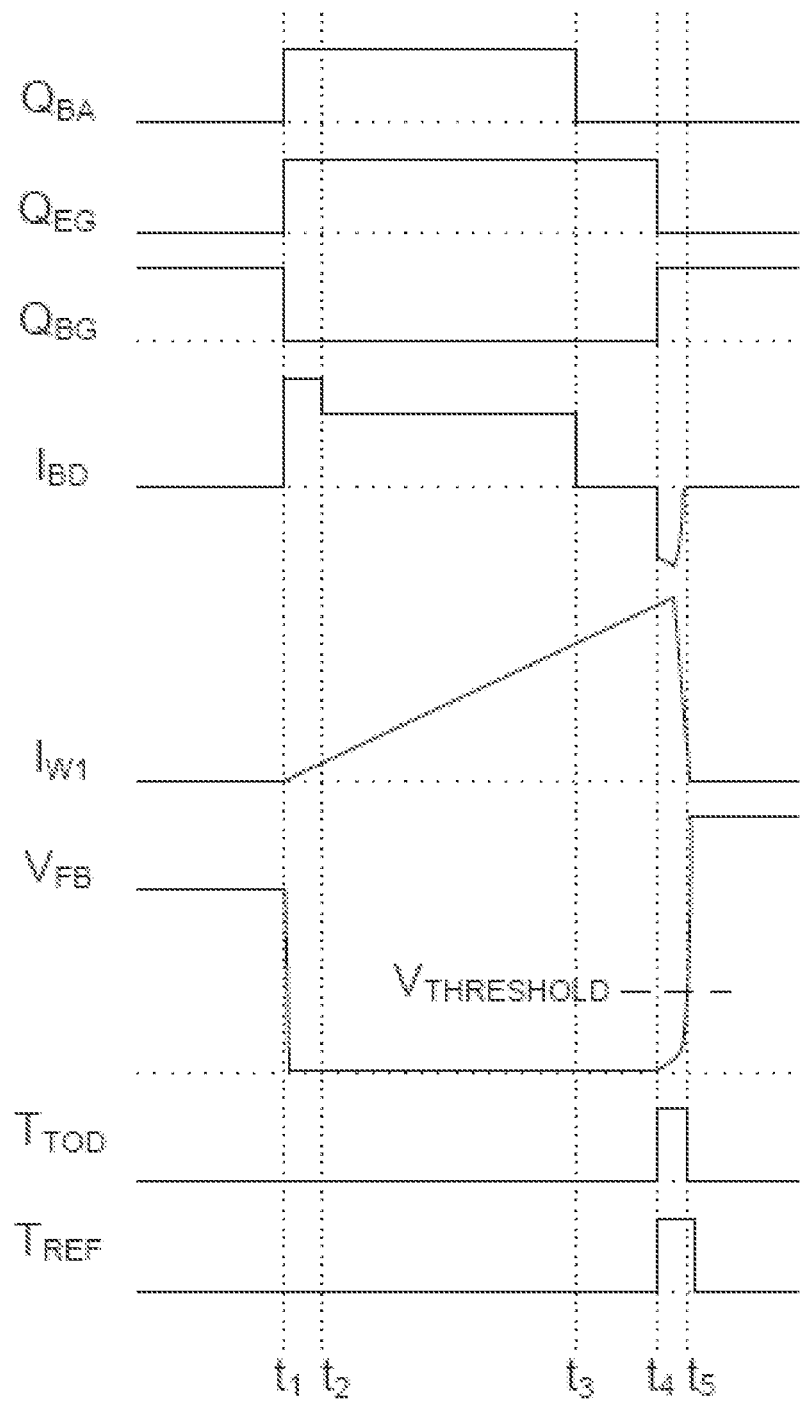
FIG. 10 shows example waveforms illustrating a BJT Base- and Emitter-Switched scheme.

A difference in FIG. 10 compared to FIG. 8 is the addition of the switching waveform $Q_{EG}$. In this example switches $Q_{BA}$ and $Q_{EG}$ are closed (i.e. turned on) simultaneously at time $t_1$, providing base current drive $I_{BD}$ out of IC terminal BD whilst the emitter terminal of $Q_{SW}$ is connected to Gnd via $Q_{EG}$. This closes $Q_{SW}$, causing current to flow through winding W1 of coupled inductor Lx to Gnd. Switch $Q_{EG}$ is opened at time $t_4$, when switch $Q_{BG}$ is closed. This provides alternative definitions for the start of the turn-off delay time to those used in the base-switching arrangement of FIG. 1. In general switch $Q_{EG}$ is controlled in opposite phase to $Q_{BG}$, with an exception described in unpublished provisional application U.S. 61/767,023 hereby incorporated by reference in its entirety. Note that between times $t_4$ and $t_5$, i.e. during the turn-off delay time, the primary inductor current continues, flowing to ground as reverse base current via the IC terminal BD and switch $Q_{BG}$. Hence switch $Q_{BG}$ must be capable of conducting currents as large as those conducted by switch $Q_{EG}$. The larger reverse base current amplitude than that depicted in FIG. 2 or FIG. 8 is due to the emitter-switched approach. This may allow a shorter target turn-off delay time to be employed than for base-only switching, as the stored charge is removed from BJT $Q_{SW}$ more quickly.

Figure 11:
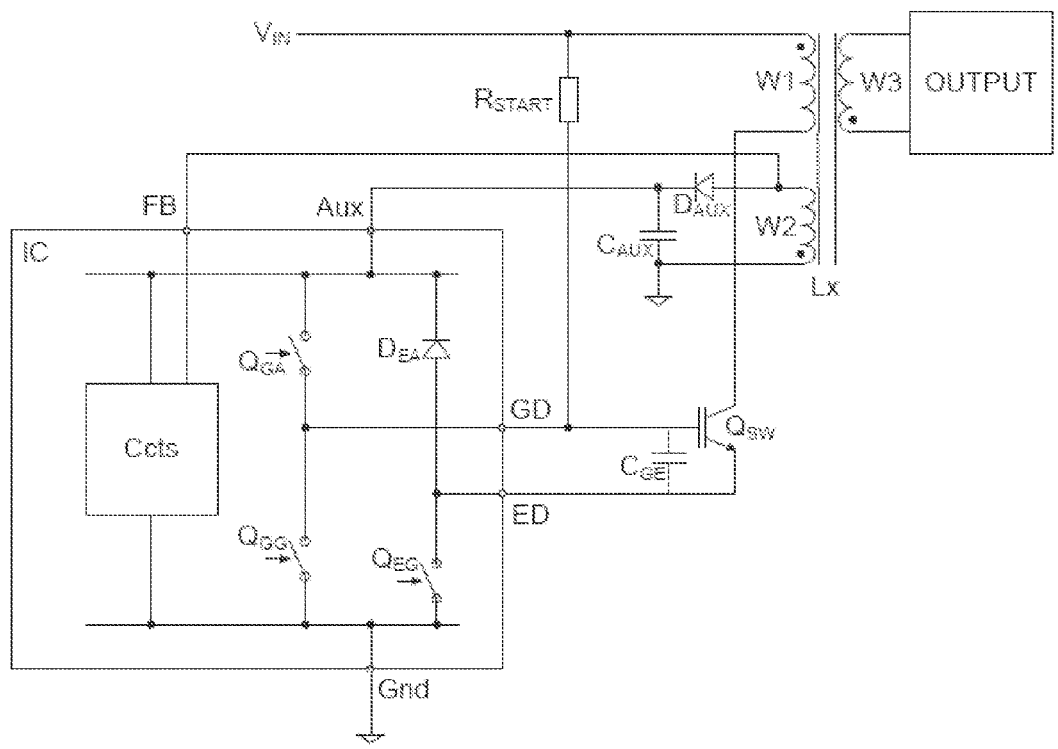
FIG. 11 is a schematic illustration of an alternative embodiment comprising an IGBT.
Figure 12A:
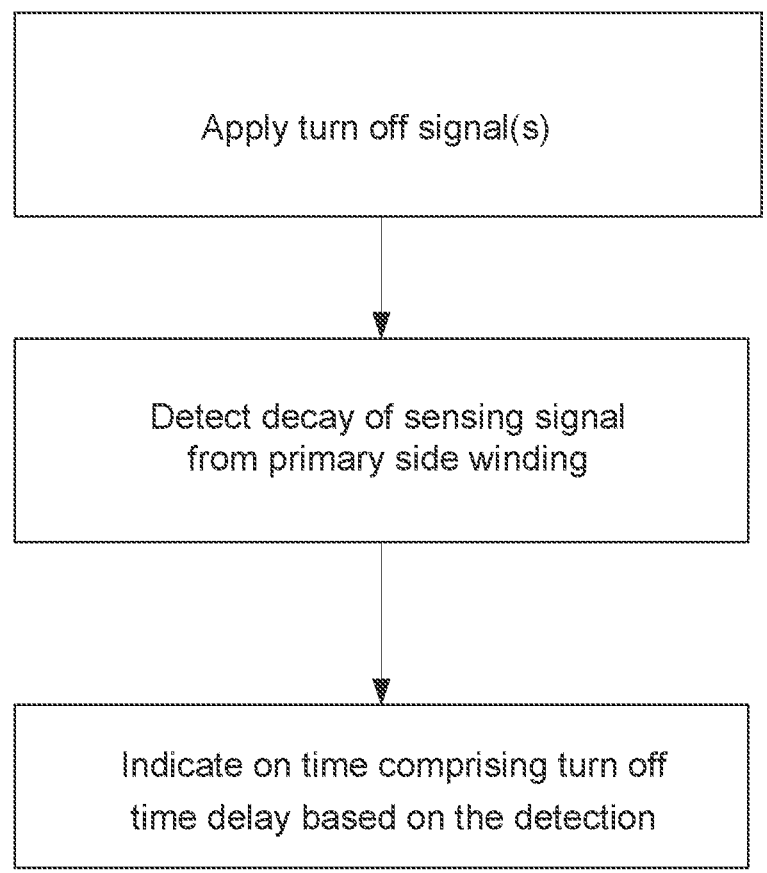
FIG. 12a shows method steps of an embodiment.
Figure 12B:
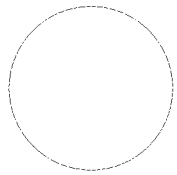
FIG. 12b shows a disc for storing computer instructions for implementing at least a part of the FIG. 12a method.
Figure 13A:
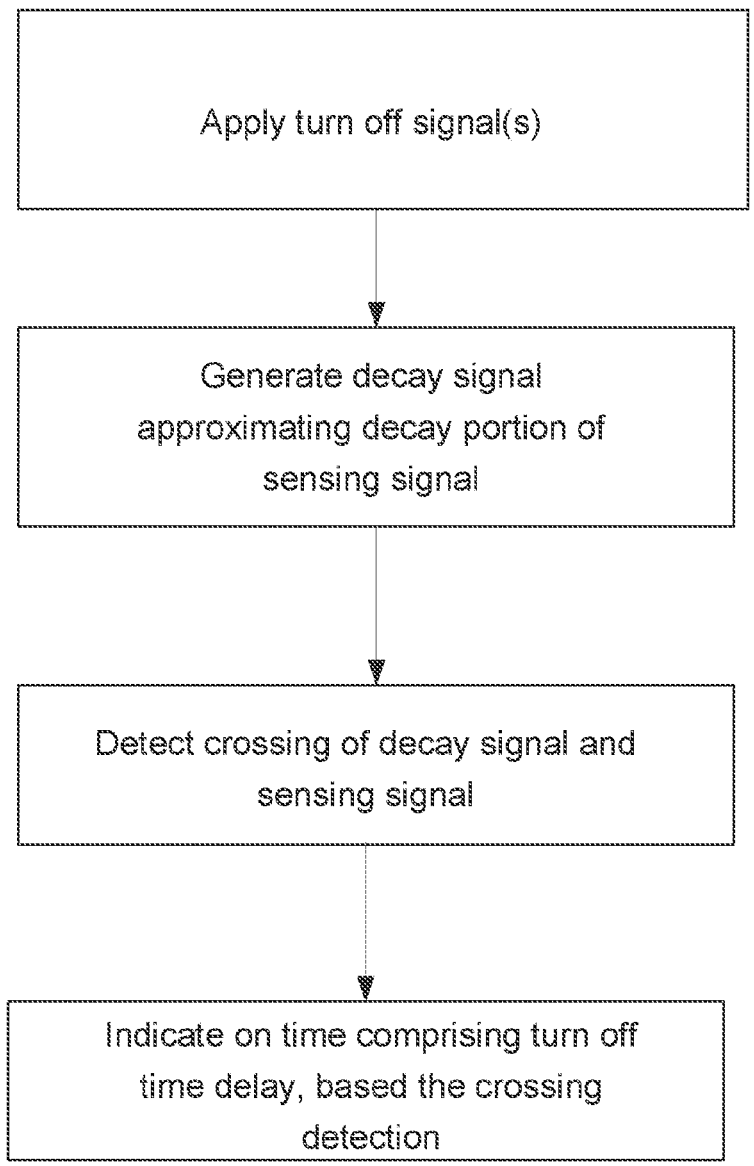
FIG. 13a shows method steps of an embodiment.
Figure 13B:
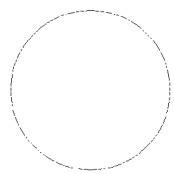
FIG. 13b shows a disc for storing computer instructions for implementing at least a part of the FIG. 13a method.
Figure 14A:
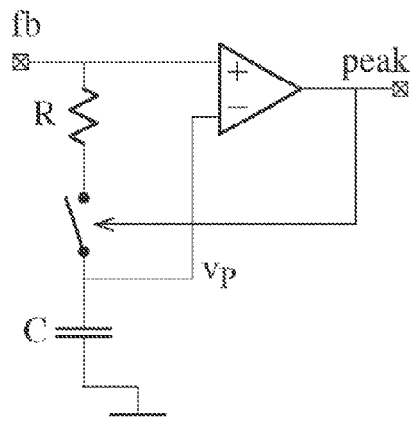
FIGS. 14a-d show, respectively, a relatively simple peak-hold detector, a leaky peak detector, a non-linear peak detector, and waveforms of these types of peak detector
Figure 14B:
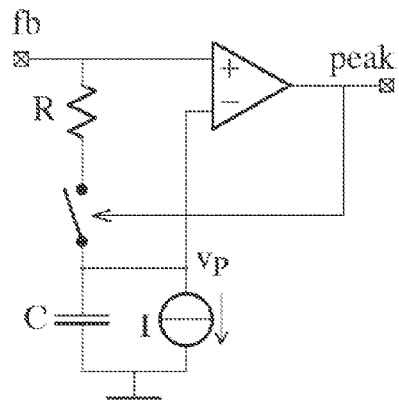
Figure 14C:
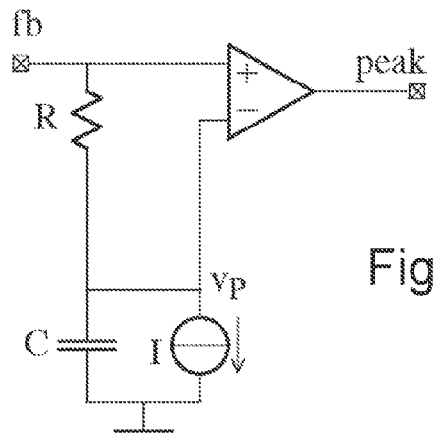
Figure 14D:
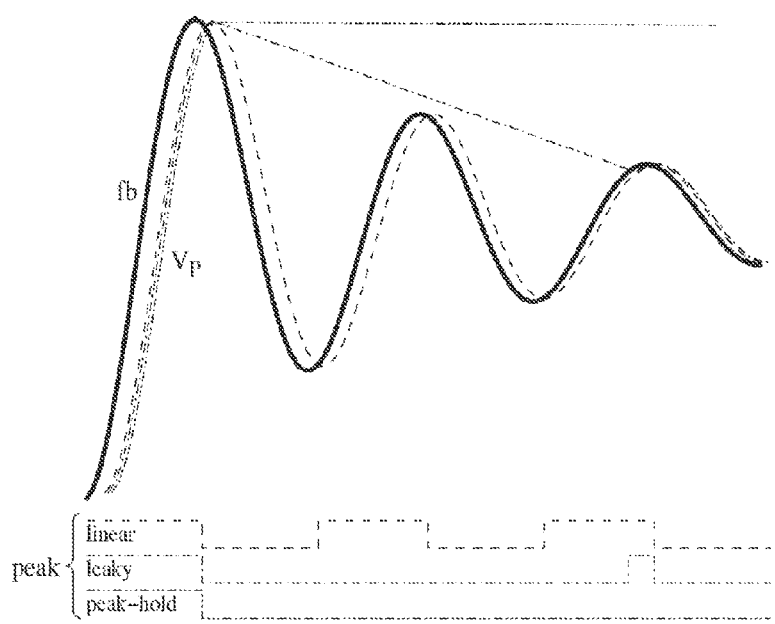

With some modifications the same approach may be taken to switch an insulated gate bipolar transistor (IGBT), as shown in the example of FIG. 11. Modifications in this alternative embodiment generally relate to the voltage-driven nature of the IGBT, in contrast to the current-driven nature of the BJT. Gate drive may be provided from a suitable voltage source, for example the Aux (Auxiliary) rail of the IC. The gate voltage amplitude and/or timing may be modulated in a similar fashion to the base current modulation described in the examples above for BJT drive. The charged IGBT gate-emitter capacitance $C_{GE}$, rather than accumulated base charge, may keep the IGBT in conduction when drive is removed from the gate terminal. As with the BJT, bipolar charges (holes and electrons) build up in the IGBT during conduction, and are preferably removed prior to completion of turn-off. Hence regulation of the turn-off delay time may be similarly beneficial to IGBTs. Although illustrated by a gate- and emitter-switched arrangement analogous to that of FIG. 9, this embodiment may equivalently employ a gate switched arrangement.

The embodiment of FIG. 11 may also be used to drive other MOS-gated devices, such as metal-oxide-semiconductor field effect transistors (MOSFETs), despite their unipolar nature. To achieve a target turn off delay with such a device, e.g., IGBT, the gate drive voltage may be modulated to vary the excess stored charge in the switching transistor, considering an IBGT as a MOS switch connecting the base of an internal PNP transistor to 0V (its emitter goes to the winding and the collector goes to 0V). In the on-state, the MOS may form a resistor providing base current from 0V. When the winding current is higher, it causes the voltage of the PNP emitter to rise, taking the base with it, so that more base current is delivered via the MOS resistance. If the MOS resistance is very low then the Vce of the PNP is correspondingly low, but to achieve this there is more excess charge in the PNP transistor, which could cause long turn-off delays and deeper saturation with higher turn-off loss. This may be mitigated by allowing a higher MOS voltage, which would be reflected in higher Vce, requiring less deep saturation. The MOS voltage may be modulated by changing the gate voltage during the on-state. To do this there would be provided a variable gate voltage drive, rather than a variable base current drive.

Regulation of the turn-off delay time for $Q_{SW}$ may be performed simultaneously with other switch control schemes. For example, wherein the durations of the on and/or off states of a power switch are adjusted in order to regulate the output voltage and/or current of the converter. In this respect the total on time of the primary switch $Q_{SW}$, represented by the period $t_1$ to $t_5$, may be controlled to implement any pulse width modulation (PWM) and/or pulse frequency modulation (PFM) type switching scheme. In this way the desired converter power transfer may be controlled. This may enable the converter to provide a specified output in the presence of variations in current and/or voltage at the input and/or output terminals. Adding turn-off delay time regulation to such output regulation control may allow power switch operation to be optimised over a wide range of power converter conditions.

Converter Configurations

Switch mode power converters are used to transform power from one voltage to another, optionally with galvanic isolation, regulation and other facilities. Many different configurations are available with which embodiments of the above described techniques may be employed, including, but not limited to: flyback, forward, buck, series-resonant and so forth. In all of these, one or more switching devices are used to "chop" the incoming power at high frequency, applying the resulting high frequency power to an inductive device to perform the transformation. Common switching devices are MOSFET, bipolar and IGBT transistors. Bipolar transistors (BJTs) are generally lower cost than other types but have more complex drive requirements. Typically it is advantageous to operate SMPCs at higher frequency to reduce overall size of the converter and this requires faster turn-on and turn-off of the switches. Bipolar transistors generally switch more slowly than MOSFETs and this is a drawback that limits their application. By carefully managing the turn-off delay time it is possible to extend the applicable frequency range of bipolar transistors while avoiding excessive power loss in the switching process.

Figure 15:
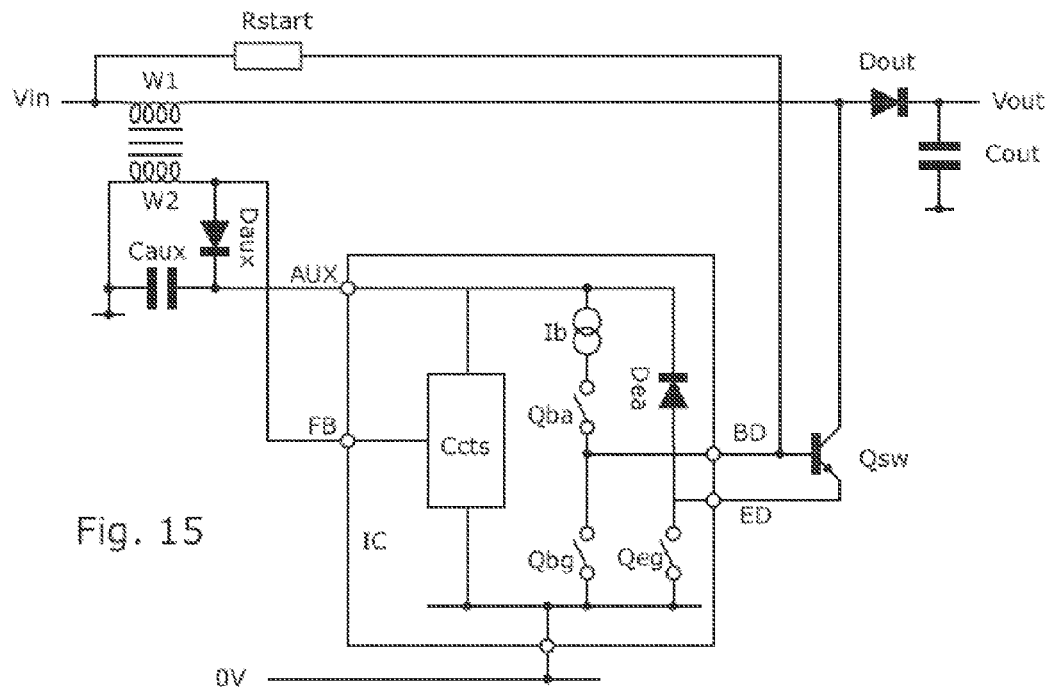
FIG. 15 shows an alternative embodiment as a boost converter

A flyback configuration has been used as an example for the application of turn-off delay time control, but the technique can be readily applied to other configurations. Likewise, base-switched (as in FIG. 1)) or emitter-switched (as in FIG. 9) transistor drive can be used, optionally with galvanic isolation. FIG. 15 shows application of the emitter-switched configuration to a boost converter. Components with the same reference in both of the Figures have similar functions. The significant difference between the boost converter of FIG. 15 and the flyback converter of FIG. 9 is that, in the boost converter, output power is taken from the winding W1 via diode Dout instead of via a separate output winding. A boost converter of this form has similar switching waveforms to a flyback converter and all aspects of turn-off time control are likewise applicable.

Figure 16A:
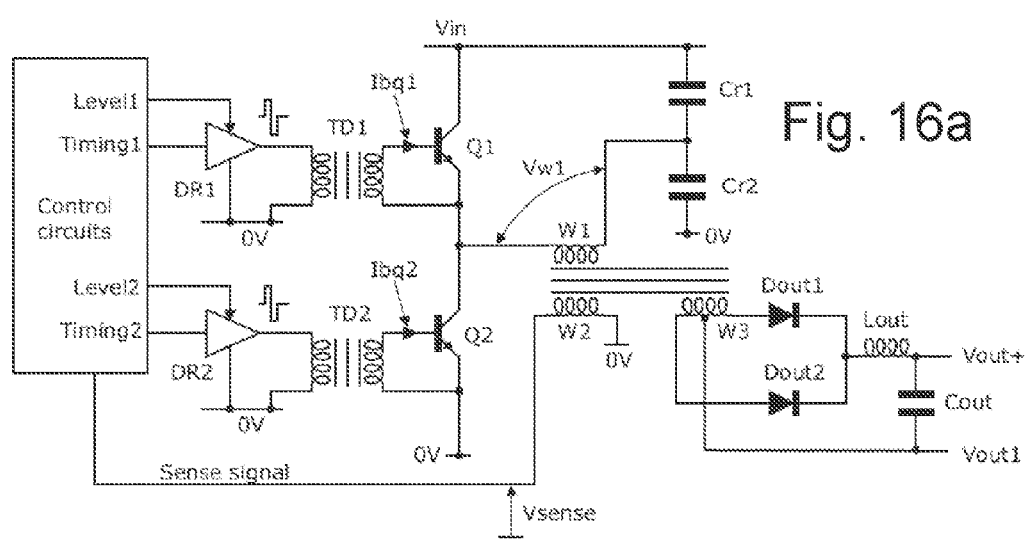
FIG. 16a shows an alternative embodiment as a forward converter with half-bridge drive.
Figure 16B:
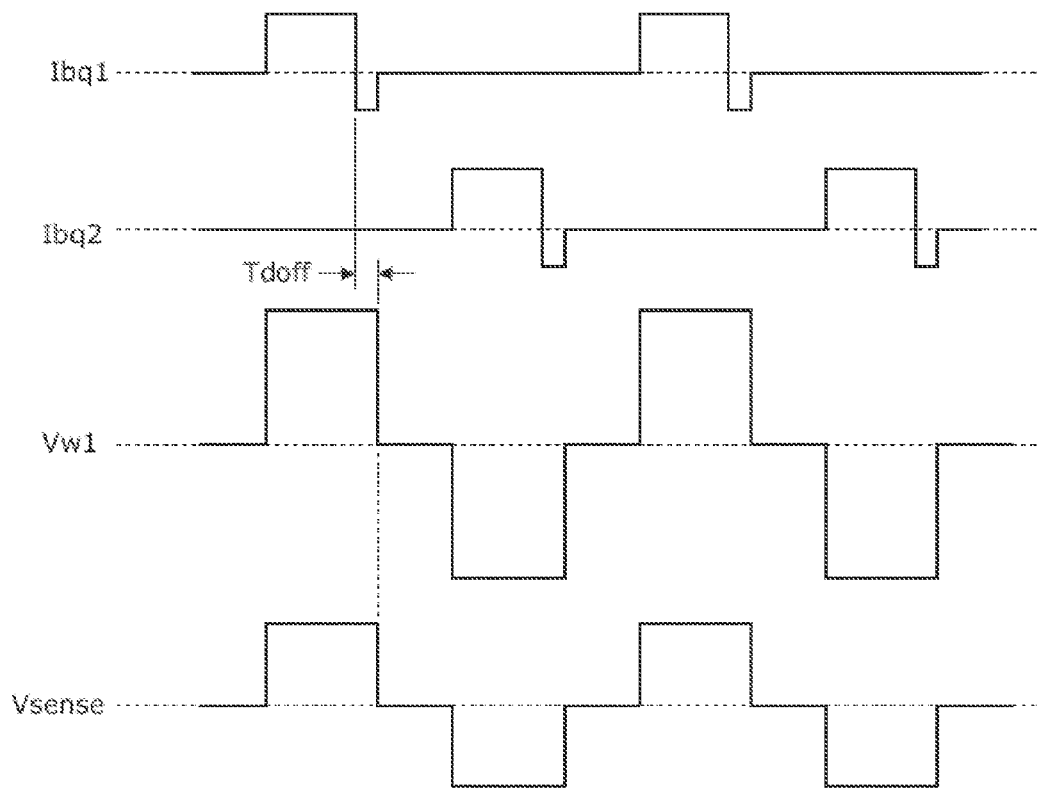
FIG. 16b shows example waveforms of a forward converter with half-bridge drive.

FIG. 16a illustrates an alternative application of the technique to an isolated forward converter using a half-bridge switching configuration. Switch transistors Q1 and Q2 apply power from the input voltage to the input winding W1 of the transformer. Output winding W3 delivers power to the output circuit with inductor Lout enabling step-down voltage regulation according to the switching pattern of Q1 and Q2 in known ways. Turn-on and -off of Q1 and Q2 is by drivers DR1 and DR2 via isolating transformers TD1 and TD2, again in known ways. Other methods of applying turn on and turn off signals to the switching transistors are known. Further winding W2 of the transformer provides a sense signal to the control circuits and may optionally also provide power to operate the circuits and drivers as described previously. The control circuits provide Timing and Level control signals to the drivers. The timing signals control the timing of the turn-on and turn-off of the drive current to the switching transistors while the Level signals control the amplitude of at least the turn-on current. Typical waveforms are shown in FIG. 16b. The drivers apply charge to the switching transistors as current Ibq1 and Ibq2 from the isolating driver transformers. Though the waveforms show constant positive current to turn the transistors on, a variety of current waveforms can be used and a two level (initial high followed by reduced current) is advantageous to speed up turn on of the transistors. Each driver is configured to apply negative current to turn off the transistor and there is a delay from the start of this negative current to the time when the collector-emitter voltage of the switch starts to rise. When it rises, the voltage across winding W1 changes accordingly as does the voltage from the sense winding W2. The control circuits process this sense signal and adapt the drive to the transistors, via Level and/or Timing signals to regulate the turn off delay time, Tdoff. Embodiments can operate with fixed level drive, but the amount of turn-on charge delivered to the switching transistors can be varied by changing the timing signals to deliver current to the transistors for varying durations.

A particular issue with half-bridge driver circuits is the critical requirement to avoid overlap of conduction of the two switches. Should this happen, very large currents can flow ("shoot-through") which is potentially destructive, as well as reducing efficiency. Fine control of the turn-off delay of a switch allows the control system to turn on the opposing switch earlier than would otherwise be the case. This, in turn, allows higher frequency switching, which enables smaller inductive components, or greater conduction duration as a fraction of the overall switching cycle. Increasing the conduction proportion generally improves efficiency because the current in the switching circuit will be lower for a given power transfer. Though shoot-through is a particular characteristic of half-bridge circuits, the benefits of faster switching allowing higher operating frequency and greater conduction proportion are applicable to all other types of SMPCs.

The configurations of FIG. 15 and FIG. 16a illustrate embodiments with isolated or non-isolated SMPC, single or multiple switching transistors, isolated or non-isolated drive to the switches and single-ended or half-bridge configurations. It will be clear to persons skilled in the art of SMPCs that the turn-off delay control technique may be applied to any of the wide range of SMPC configurations.

Sensing Turn-Off

We now describe some further examples of techniques for detecting turn-off which may be employed to regulate turn-off delay of power switching transistors. This is difficult because of varying converter operating conditions (input voltage, switch characteristics, conduction time etc.). For bipolar transistors (BJT, IGBT), turn off is not a well-defined transition and is further obscured by current flow through the device due to capacitive currents.

Figure 17:
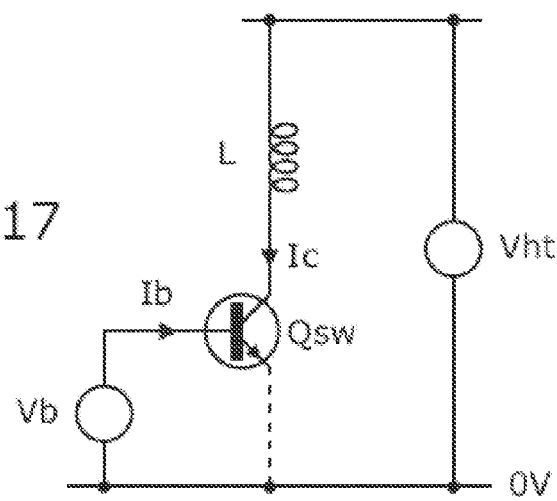
FIG. 17 shows a simplified switching circuit relevant to turn-off conditions of a switching transistor in a SMPC

SMPCs using bipolar transistors are typically constructed using circuits comprising a power source, the collector—emitter conduction path through the BJT or IGBT switch and some inductive component as shown in FIG. 17. The emitter circuit may include an emitter switch or may be coupled to the supply by some low-resistance path. During the on state of the switch, current builds up and flows around the circuit. As the switch turns off, the voltage across the conduction terminals (collector C and emitter E) rises rapidly due to the effect of established current flow in the inductance. Note that the nature of the inductance varies between converter types. For Flyback, boost and buck converters it is the total component inductance, the voltage only becoming clamped when the rectifier diode starts to conduct power to the load. In forward converters it may be the leakage inductance of the transformer or some inductance in the secondary circuit reflected to the primary. Whatever the nature of the inductance, the current/voltage characteristic of the switch load is inductive at turn off which means the C-E voltage typically rises and inductor current continues to flow. Interruption of current flow is normally caused by turn-off of the switch rather than any effect in the inductive component. Transistor turn-off is progressive, the switch current reduces during the turn off process. Over a short timescale, the inductive load current can be considered constant so the excess current goes into charging circuit capacitances (such as $C_{BC}$, $C_{BE}$ and self capacitance of the winding—not shown) yielding a rate of change of collector voltage.

Figure 18:
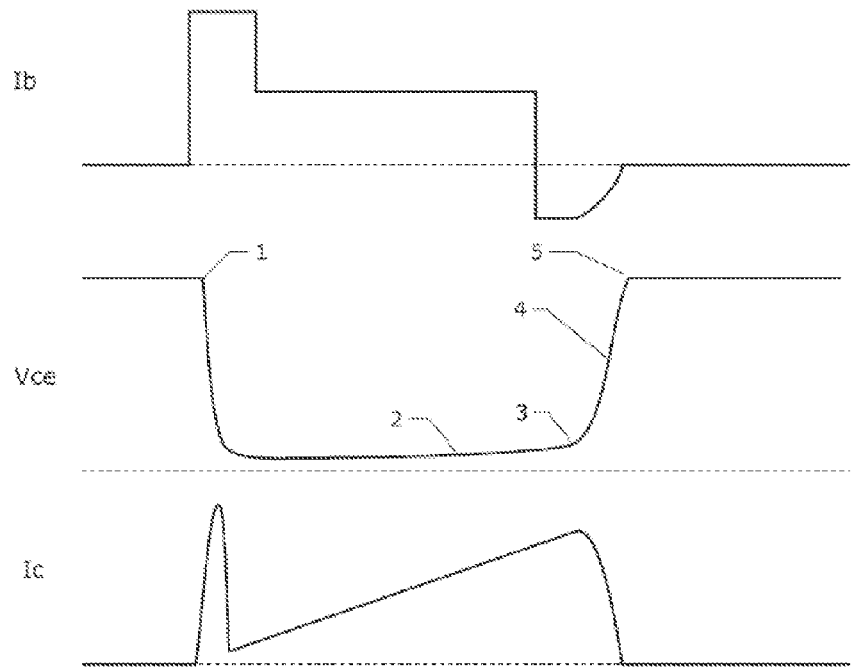
FIG. 18 shows example waveforms of bipolar switching transistor in a SMPC.

FIG. 18 illustrates currents and C-E voltage of a typical bipolar switch in a flyback SMPC operating from a high voltage power source, and is not to scale. Other converter types have different patterns of the current flow within the conduction time, but turn-off behaviour is similar. Key points of the C-E voltage are marked:

1. After a turn-on delay, C-E current flow start and causes fall of C-E voltage. Current goes to discharge circuit capacitances and may also build in the inductor circuit (continuous conduction mode flyback/boost, buck converters etc.).
2. During the main conduction time, inductor current typically increases and there is an associated small increase of C-E voltage on-state voltage
3. Turn-off is initiated by reversal of the base current by the control circuit. There is little immediate effect on the C-E voltage but as base charge is removed, the transistor can no longer sustain the whole inductor current at the previous low collector voltage. As the collector voltage rises, the transistor can conduct the current. Consequently the initial rise of C-E voltage is dependent on the Ic/Vce characteristics with reducing base charge.
4. After the C-E voltage rises above a few volts, the transistor can no longer sustain the inductor current at any collector voltage so the excess current goes into circuit capacitances (including the base-collector capacitance), and the C-E voltage rises rapidly 5. When the rectifier of the SMPC comes into conduction, the C-E voltage stops rising (or slows considerably) as inductive current is diverted away from the transistor This illustrates the progressive nature of turn-off and the actual turn off point can be defined arbitrarily, but is in the region of point 3 in FIG. 18. A system to regulate turn off delay needs to detect a point such as 3.

Direct sensing of the C-E voltage allows comparison to a threshold voltage as described in prior art. However this often requires discrimination of relatively low voltages (a few volts) while sustaining fast transitions to very high switching voltages in the off state (in the context of SMPCs operating from high voltage power sources). This is difficult and expensive to implement. In addition the on-state voltage is unpredictable, being affected by load current, device performance, temperature etc. and this makes choice of threshold voltage difficult.

Figure 19:
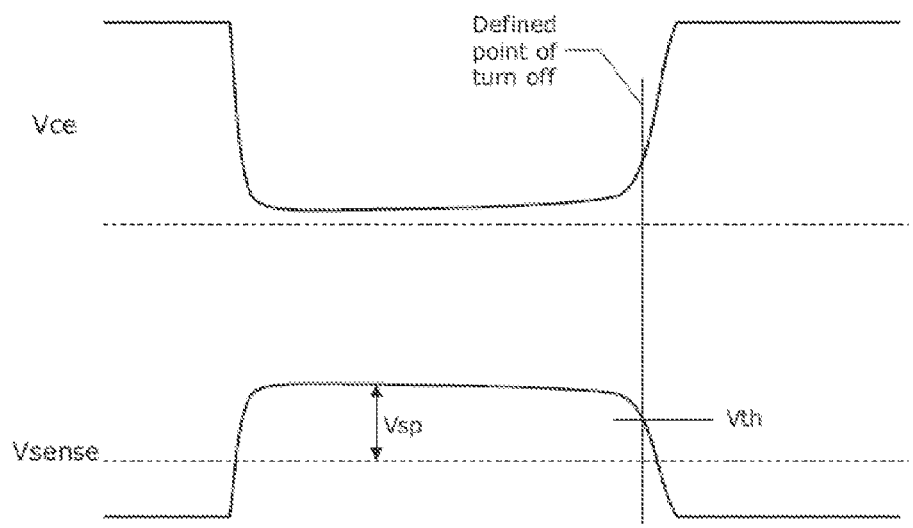
FIG. 19 shows example waveforms of indirect sensing of bipolar switching transistor in a SMPC.

Indirect sensing via a coupled winding avoids the difficulty of withstanding high voltages and allows lower cost, possibly integrated, circuits to discriminate the turn off point. FIG. 19 illustrates voltage waveforms from a coupled winding. Note that the phase of the winding has been arranged to invert the sensed voltage relative to the C-E voltage and the scale of the sensed voltage depends on the turns ratio of the windings. Zero volt conditions do not coincide because of the nature of inductive coupling and the supply voltage in the switch circuit. In a flyback converter, for example, Vsp=Vht/Nt−Von. Where Nt is the turns ratio and Von is the on-state C-E voltage. Therefore, Vsp is affected by supply voltage and behaviour of the transistor. Discriminating a turn off point reliably by this method employs comparison of Vsense to some reference or threshold voltage, illustrated as Vth. If Vht and Von vary little then it may be possible to use a fixed threshold (offset) as Vth. However, if either changes substantially then an adaptive reference may be used.

Various methods can be used, as illustrated in FIG. 20.

FIG. 20a (Similar to FIG. 6) shows a method where the sense voltage is sampled at some time during the conduction condition according to a timing signal produced by a control circuit. The sampled voltage is then offset by a fixed amount and used as a reference comparison to the sense signal to determine when the sense voltage has changed by more than the threshold amount.

Figure 20C:
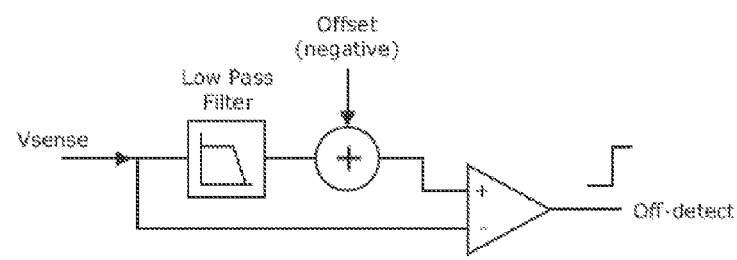
FIG. 20c shows a sensing discriminator for turn-off detection using a low pass filter, and associated waveforms.

FIG. 20b uses a time delay (Td) and an offset to create a reference signal, again for comparison to the sense signal, giving an off-detect signal in a similar way FIG. 20c has a low pass filter in place of the time delay of FIG. 20b. A filter characteristic is chosen to have an appropriate and, approximately, steady group delay (Tgd) across the relevant frequency range (pass and transition band of the filter).

Figure 20D:
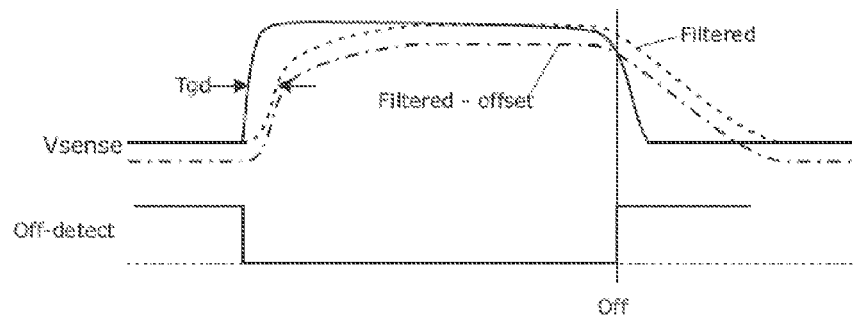
FIG. 20d shows a sensing discriminator for turn-off detection using a high pass filter, and associated waveforms.
Figure 20D:
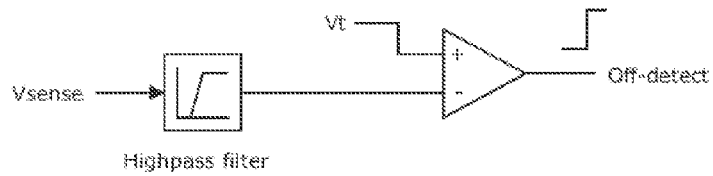
Figure 20D:
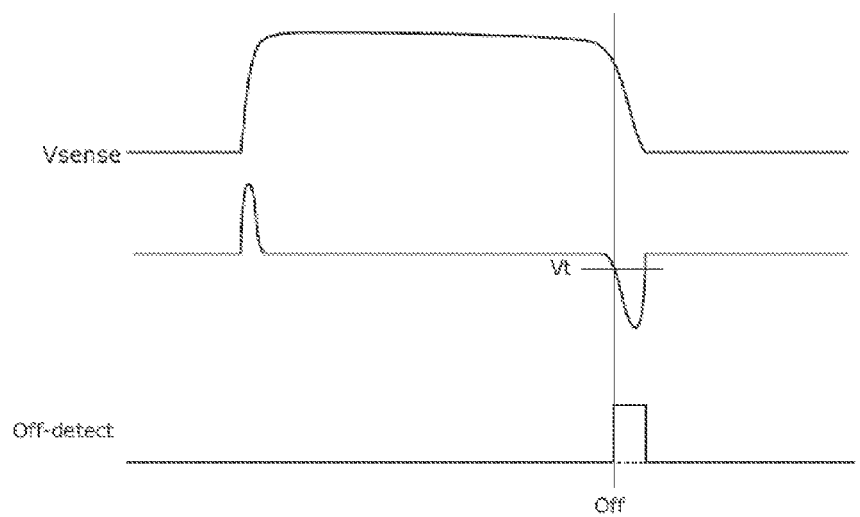

Converse to using a lowpass filter in the reference path it is possible to use a highpass filter as shown in FIG. 20d. A highpass characteristic gives an output sensitive to change of input. A differentiator is a special case where the highpass characteristic rises linearly with frequency. Such a characteristic is not ideal for this application since it becomes excessively sensitive to small, but fast, deviations of the signal. Better is a highpass characteristic with a "shelf" above some cutoff frequency. With such a filter it may be possible to use a simple fixed threshold to produce a reliable off-detect signal from the highpass output. Alternatively, the threshold may be adapted according to the peak value of the sense signal, derived by other circuits not shown.

Though the amplitude and timing of the sense signal may vary considerably in any SMPC application, the maximum value of the sense signal (assuming polarity is as illustrated) represents a state where the switch is reliably on. Hence a peak detector may be used to capture this value to use, with an offset, as a reference to determine turn off. This is illustrated in FIG. 20e. A peak detector has to be reset otherwise it will hold its output indefinitely so would not respond to subsequent changes in conditions. Reset can be triggered by a signal from a control circuit any time after turn-off has been detected but before the next conduction state of the switch.

It is possible to configure a peak detector to "self reset" by leaking away the peak value over time. Such a detector can be used in place of the resettable peak detector of FIG. 20e. The arrangement and waveforms are shown in FIG. 20f. Provided the peak detector decays faster than the conditions of the SMPC change (e.g. Vht) then the detector will reliably re-capture the peak of the sense signal on each cycle of the SMPC. Examples of decaying peak detector circuits are shown in FIG. 21. In FIG. 21a, capacitor C holds the peak value set by the amplifier with its negative feedback and the diode. The current sink causes the capacitor voltage to decay at a constant rate whenever the rate of decay of the sense signal is faster than that rate. A resistor is shown in FIG. 21b in place of the current sink of FIG. 21a. This gives an exponential decay and may be equally effective in this application.

Note that in all of the above, the offset may be applied before the comparison to either the sense signal or to the processed signal. Further, the offset may be replaced or supplemented by a scaling function so that the effective offset reduces as Vht (or other switching voltage) reduces.

Advantages, any one or more of which may be achieved by any of the embodiments, are:
brings known benefits of storage time/turn-off delay time regulation (e.g. minimal base drive power dissipation for given performance, reliable fast switching, high efficiency, and/or allows wide range of BJTs to be accommodated, etc.), at zero incremental cost for some PSS flyback embodiments due to use of a low voltage coupled winding;
reduces or avoids offset problems associated with measuring an absolute voltage as the threshold for 'end of turn-off delay time', thereby serving a wider range of BJTs, converter types and/or line and load conditions, etc.

No doubt many other effective alternatives will occur to the skilled person. It will be understood that the invention is not limited to the described embodiments and encompasses modifications apparent to those skilled in the art lying within the spirit and scope of the claims appended hereto.

We claim:

1. A controller for use in a power converter, the controller comprising:
a first terminal to provide a turn on signal to initiate turning on of a power switch;
a second terminal to provide a turn off signal to initiate turning off the power switch;
a detection circuit coupled to detect a turn off time delay; and
a control circuit coupled to control the turn on signal to regulate the turn off delay time to a target time value, wherein the control circuit controls the turn on signal by controlling an amount of charge delivered to turn on the power switch.

2. The controller of claim 1, wherein the control circuit is coupled to control the amount of charged delivered by controlling a voltage source or a current source in response to a comparison between the turn off time delay and the target time value.

3. The controller of claim 1, wherein the control circuit is coupled to vary the target time value in response to one of: an input voltage of the power converter, a temperature of the power converter, a temperature of the power switch, a switching frequency of the power switch, an on-time of the power switch, or an output power of the power converter.

4. The controller of claim 1, wherein the control circuit is coupled to select the target time value to balance an increased input charge amount for a low on-state voltage drop across conduction terminals of the power switch with an energy loss during turn off of the power switch to reduce power loss of the power converter.

5. The controller of claim 1, wherein the control circuit is coupled to control a duration of the turn on signal to regulate the turn off delay time to the target time value.

6. The controller of claim 1, further comprising:
a device control signal source, wherein the device control signal source is coupled to provide a control signal to drive the power switch on;
a first switch coupled to receive the turn on signal, wherein the turn on signal controls the first switch to couple the device control signal source to a control terminal of the power switch to turn the power switch on; and
a second switch coupled to receive the turn off signal, wherein the turn off signal controls the second switch to couple a reference voltage to the control terminal of the power switch to turn the power switch off.

7. The controller of claim 6, wherein the first switch decouples the device control signal source from the control terminal of the power switch and the second switch couples the reference voltage to the control terminal of the power switch to turn the power switch off.

8. The controller of claim 6, wherein the control signal has a first amplitude to turn the power switch on and a second amplitude to maintain the power switch on, wherein the second amplitude is less than the first amplitude.

9. The controller of claim 8, wherein the control circuit is coupled to regulate the second amplitude or a duration which the control signal is substantially equal to the second amplitude to regulate the turn off time delay.

10. The controller of claim 6, wherein the controller further comprises:
a third terminal to provide an emitter signal; and
a third switch coupled to receive the emitter signal, wherein the emitter signal controls the third switch to couple an emitter terminal of the power switch to the reference voltage.

11. The controller of claim 1, wherein the power switch is a bipolar junction transistor (BJT) or an insulated gate bipolar transistor (IGBT).

12. The controller of claim 1, wherein the detection circuit is coupled to receive a sense signal representative of a base current of a control terminal of the power switch, wherein the detection circuit is coupled to determine an end of the turn off time delay when positive base current is removed or negative base current flows through the control terminal.

13. The controller of claim 1, wherein the detection circuit is coupled to receive a sense signal representative of a collector voltage of the power switch, wherein the detection circuit is coupled to determine an end of the turn off time delay when the collector voltage rises above a threshold.

14. The controller of claim 1, wherein the detection circuit is coupled to receive a sense signal representative of a collector current of the power switch, wherein the detection circuit determines an end of the turn off time delay when the collector current falls below a threshold.

15. The controller of claim 1, wherein the detection circuit is coupled to receive a sense signal representative of a voltage across conduction terminals of the power switch to determine an end of the turn off time delay.

16. The controller of claim 15, wherein the detection circuit further comprises a comparator coupled to receive the sense signal and a sensing reference, wherein the sensing reference is generated from the sense signal and the detection circuit is coupled to determine the end of the turn off time delay when the sense signal reaches the sensing reference.

17. The controller of claim 16, wherein the detection circuit is a peak detector.

18. The controller of claim 16, wherein the detection circuit further comprises a sample and hold circuit, wherein the sensing reference is a sampled and held value of the sense signal.

19. The controller of claim 16, wherein the sensing reference is a low pass filtered and offset version of the sense signal.

20. The controller of claim 16, wherein the sensing reference is a delayed and offset version of the sense signal.

21. The controller of claim 16, wherein the sensing reference is a sampled and offset version of the sense signal.

22. The controller of claim 16, wherein the sensing reference is a high pass filtered and offset version of the sense signal.

23. The controller of claim 16, wherein the sensing reference is a peak detected and offset version of the sense signal.

24. The controller of claim 16, wherein the sensing reference is a decayed peak detection and offset version of the sense signal.

25. The controller of claim 1, wherein the turn off time delay is the duration of time between an initiating of a turn off of the power switch by the turn off signal and an actual turn off of the power switch.

* * * * *